US011696043B2

(12) United States Patent
Borremans et al.

(10) Patent No.: US 11,696,043 B2
(45) Date of Patent: *Jul. 4, 2023

(54) WHITE BALANCE COMPENSATION USING A SPECTRAL SENSOR SYSTEM

(71) Applicant: Spectricity, Mechelen (BE)

(72) Inventors: Jonathan Borremans, Lier (BE);
Ruben Lieten, Heverlee (BE); Ward van der Tempel, Keerbergen (BE); Maarten De Bock, Ghent (BE); Jakub Raczkowski, Bertem (BE)

(73) Assignee: Spectricity, Mechelen (BE)

( * ) Notice: Subject to any disclaimer, the term of this patent is extended or adjusted under 35 U.S.C. 154(b) by 0 days.

This patent is subject to a terminal disclaimer.

(21) Appl. No.: 17/340,449

(22) Filed: Jun. 7, 2021

(65) Prior Publication Data
US 2022/0006994 A1 Jan. 6, 2022

Related U.S. Application Data

(60) Provisional application No. 63/066,507, filed on Aug. 17, 2020, provisional application No. 63/047,084, filed on Jul. 1, 2020.

(51) Int. Cl.
*H04N 23/88* (2023.01)
*H01L 27/146* (2006.01)
(Continued)

(52) U.S. Cl.
CPC ............... *H04N 23/88* (2023.01); *G01J 3/26* (2013.01); *G02B 26/001* (2013.01); *H01L 27/14621* (2013.01)

(58) Field of Classification Search
CPC ........... H04N 9/735; H04N 23/88; G01J 3/26; G02B 26/001; G02B 5/008; G02B 5/201;
(Continued)

(56) References Cited

U.S. PATENT DOCUMENTS

| 2003/0091232 A1* | 5/2003 | Kalevo | ..................... G06T 7/13 382/167 |
| 2006/0221346 A1* | 10/2006 | Mestha | ................ G02B 26/001 356/454 |

(Continued)

*Primary Examiner* — Abdelaaziz Tissire
(74) *Attorney, Agent, or Firm* — Garlick & Markison; Kelly H. Hale

(57) ABSTRACT

A system for imaging a scene, includes a plurality of optical sensors arranged on an integrated circuit and a plurality of sets of interference filters, where each set of interference filters of the plurality of sets of interference filters includes a plurality of interference filters that are arranged in a pattern and each interference filter of the plurality of filters is configured to pass light in a different wavelength range, where each set of interference filters of the plurality of interference filters is associated with a spatial area of the scene. The system includes a plurality of rejection filters arranged in a pattern under each set of interference filters, where each rejection filter of the plurality of rejection filters is configured to substantially reject light of predetermined wavelengths. The system further includes one or more processors adapted to provide a spectral response for a spatial area of the scene associated with the set of interference filters.

20 Claims, 26 Drawing Sheets

(51) Int. Cl.
*G01J 3/26* (2006.01)
*G02B 26/00* (2006.01)

(58) Field of Classification Search
CPC .............. G02B 5/288; H01L 27/14621; H01L 27/14643; H01L 27/14623
See application file for complete search history.

(56) References Cited

U.S. PATENT DOCUMENTS

| | | | | |
|---|---|---|---|---|
| 2008/0130031 | A1* | 6/2008 | Dosluoglu | G06T 3/4015 358/1.9 |
| 2009/0252411 | A1* | 10/2009 | Siddiqui | G06T 3/4015 382/167 |
| 2010/0140461 | A1* | 6/2010 | Sprigle | A61B 5/441 250/226 |
| 2012/0187512 | A1* | 7/2012 | Wang | H01L 27/14618 257/E31.127 |
| 2014/0084404 | A1* | 3/2014 | Fukunaga | H01L 27/14643 257/432 |
| 2015/0070528 | A1* | 3/2015 | Kikuchi | H04N 9/07 348/224.1 |
| 2017/0041560 | A1* | 2/2017 | Gotoh | G01J 3/2823 |
| 2017/0339353 | A1* | 11/2017 | Banachowicz | H04N 25/70 |
| 2017/0374306 | A1* | 12/2017 | Vaartstra | H01L 27/14645 |
| 2018/0182798 | A1* | 6/2018 | Tack | H01L 27/14623 |
| 2018/0204863 | A1* | 7/2018 | Tack | G01J 3/36 |
| 2019/0067344 | A1* | 2/2019 | Geelen | H01L 27/1462 |
| 2019/0179067 | A1* | 6/2019 | Houck | G02B 5/26 |
| 2020/0326235 | A1* | 10/2020 | Tisserand | H04N 9/735 |
| 2021/0033466 | A1* | 2/2021 | Kim | G01J 3/1895 |
| 2022/0003907 | A1* | 1/2022 | Borremans | G02B 5/281 |

* cited by examiner

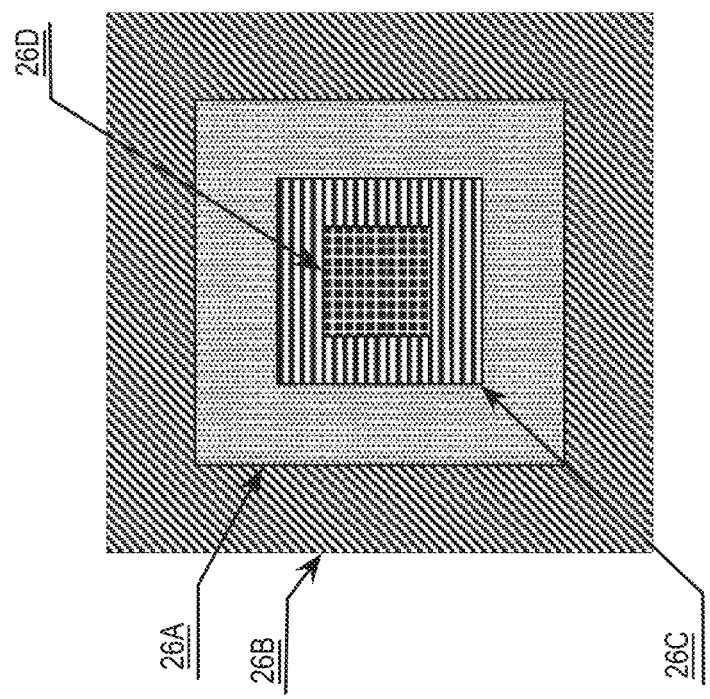
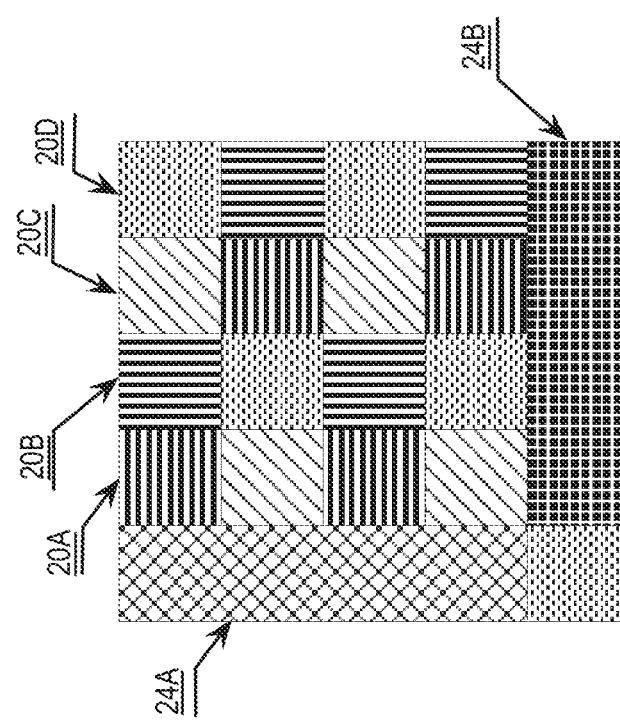

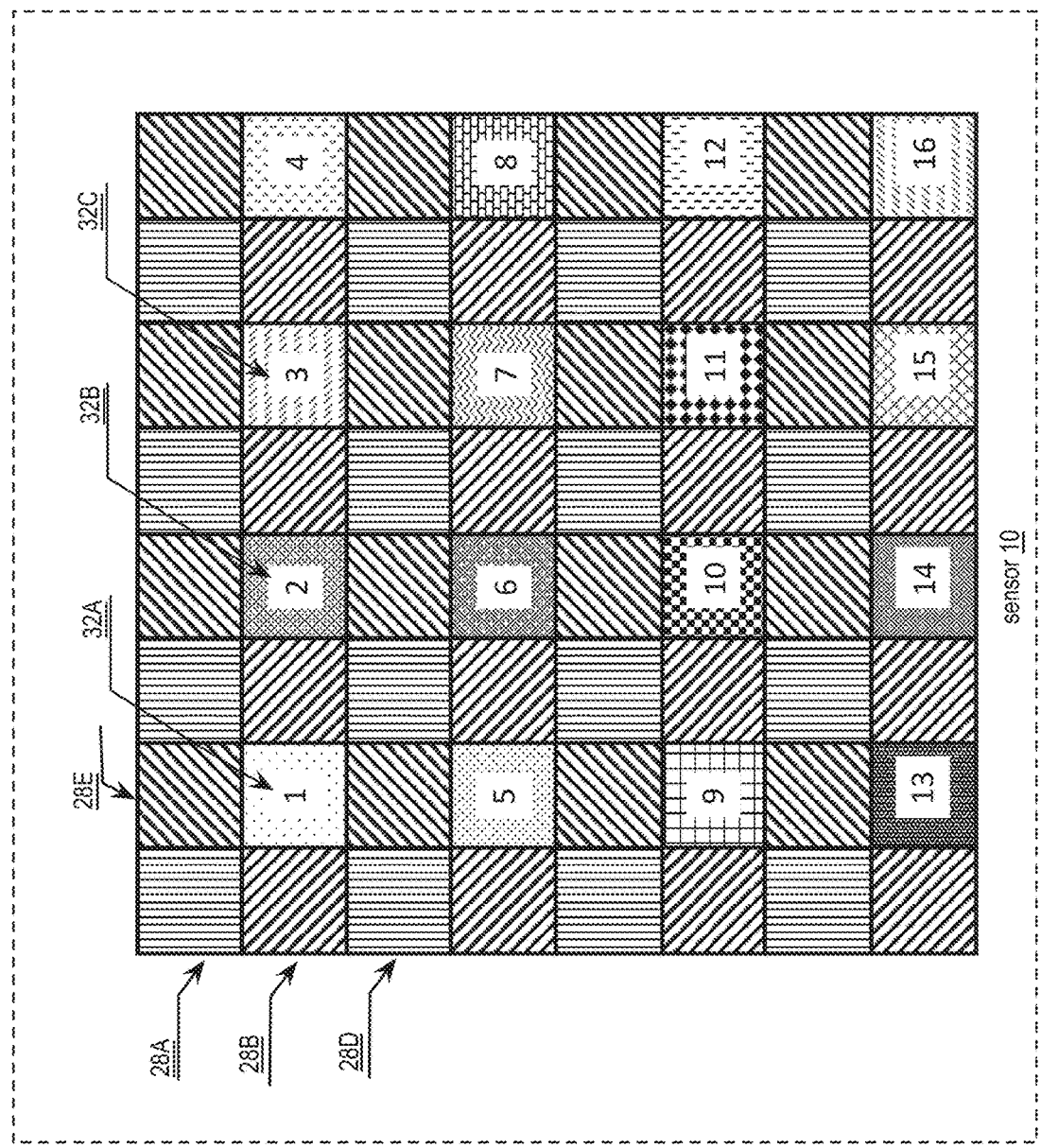

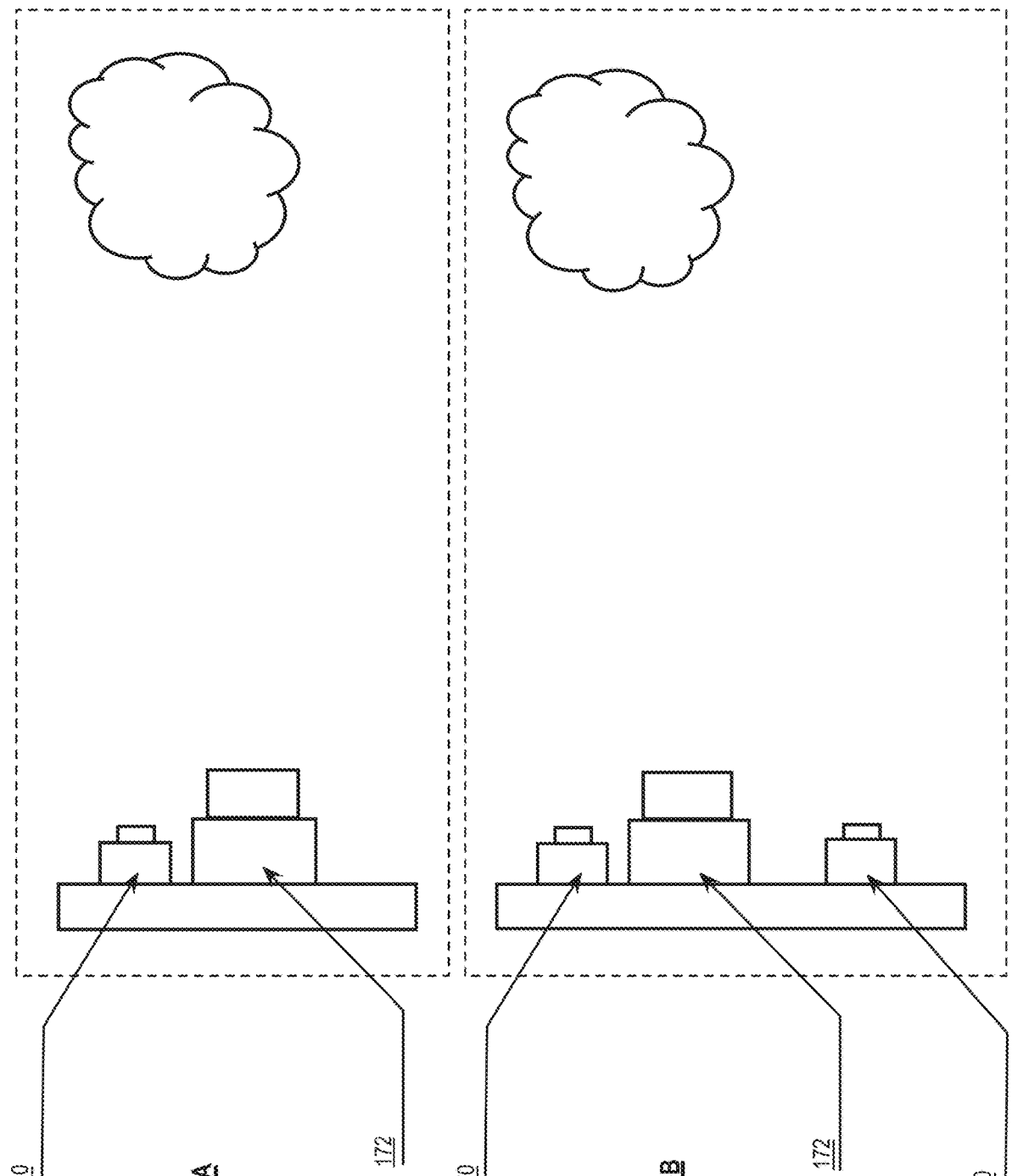

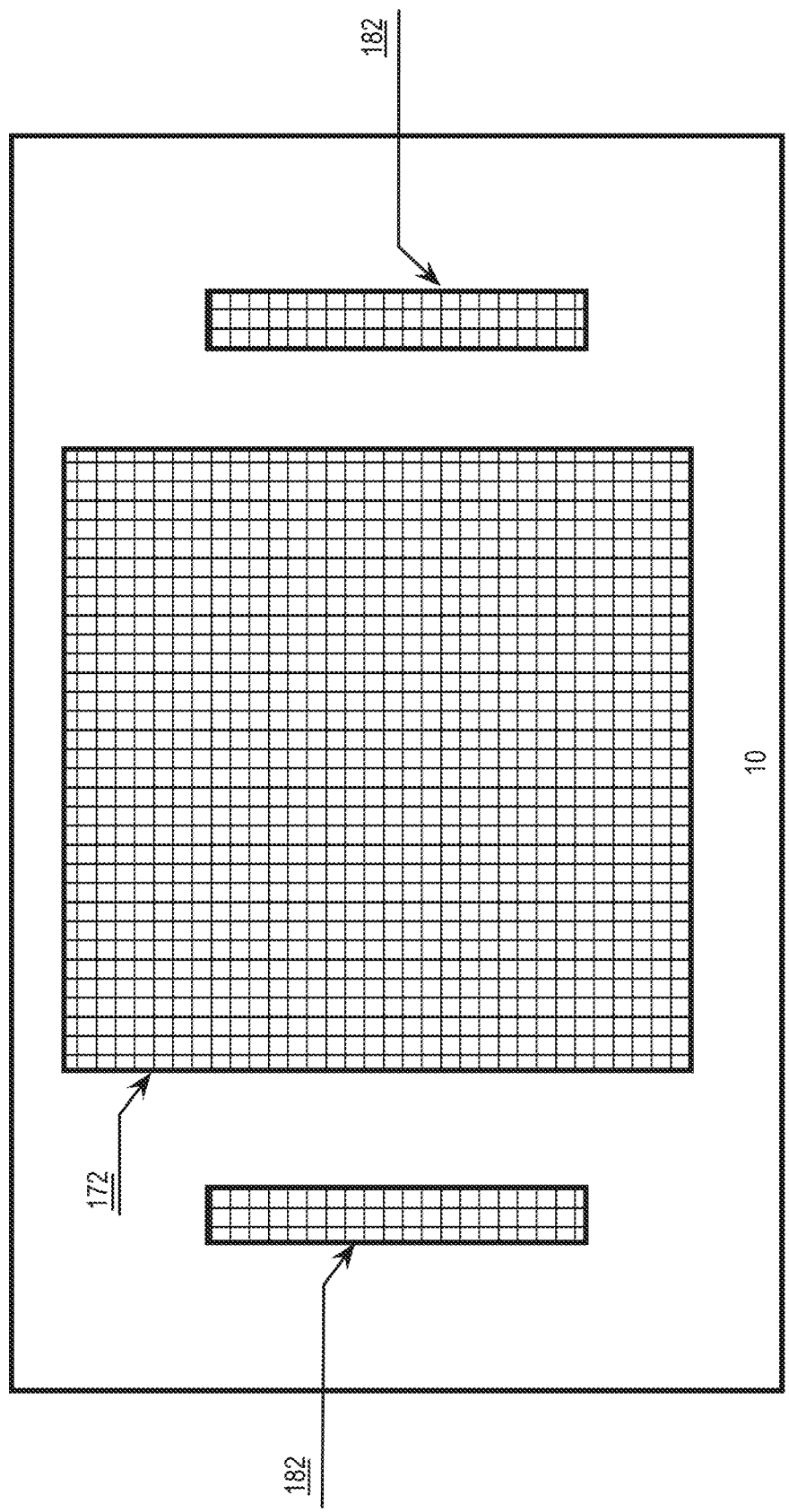

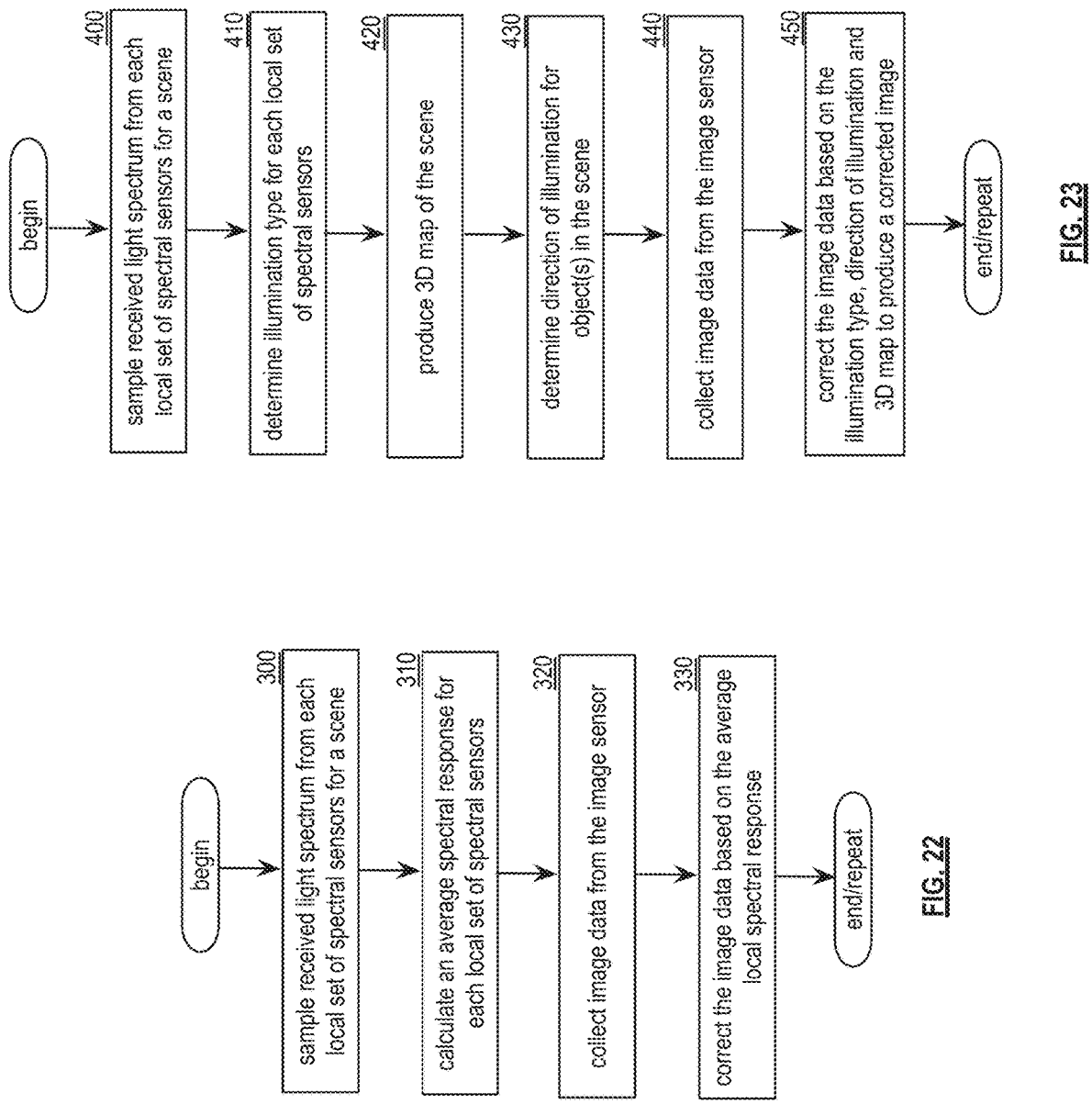

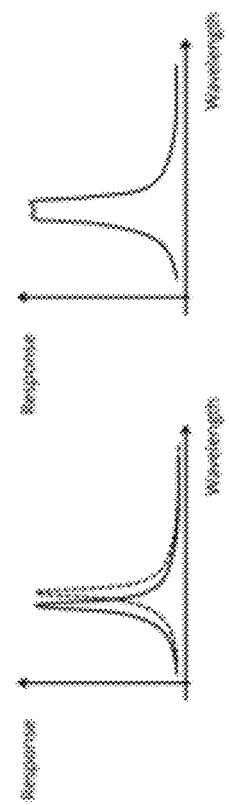
FIG. 29A
FIG. 29B
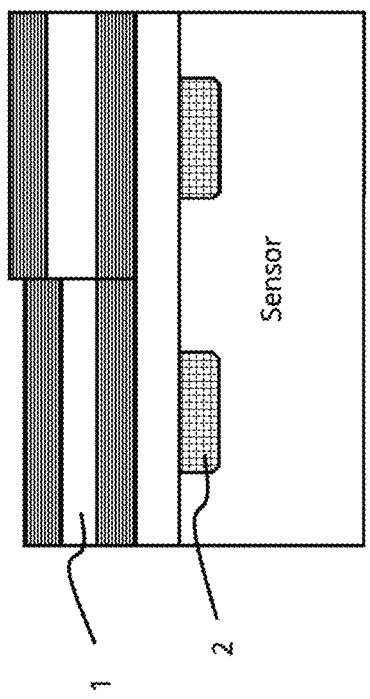
FIG. 29C
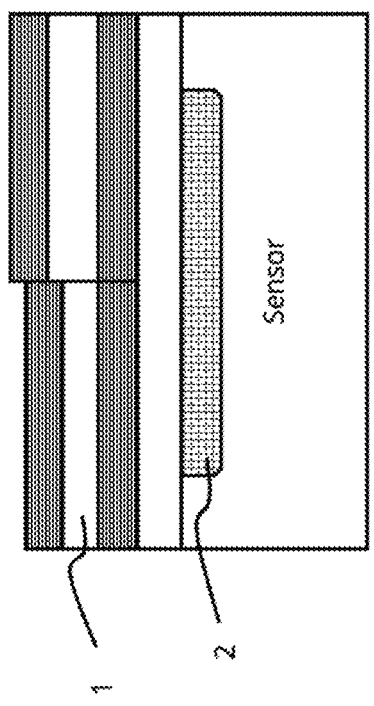
FIG. 29D
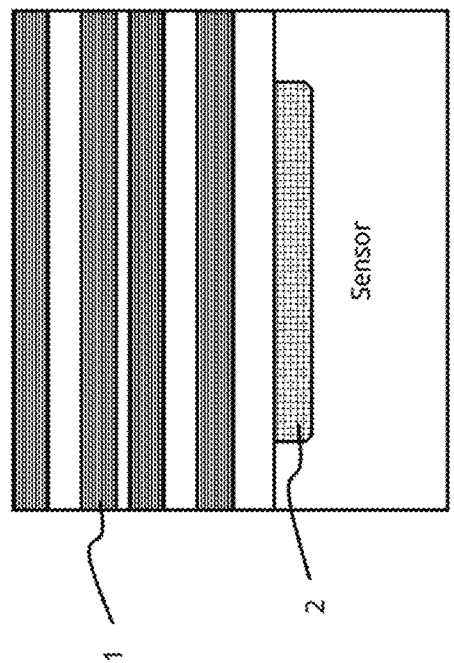
FIG. 29E

WHITE BALANCE COMPENSATION USING A SPECTRAL SENSOR SYSTEM

CROSS REFERENCE TO RELATED PATENTS

The present U.S. Utility Patent Application claims priority pursuant to 35 U.S.C. § 119(e) to U.S. Provisional Application No. 63/066,507, entitled "WHITE BALANCE COMPENSATION USING A SPECTRAL SENSOR SYSTEM," filed Aug. 17, 2020; and U.S. Provisional Application No. 63/047,084, entitled "WHITE BALANCE COMPENSATION USING A SPECTRAL SENSOR SYSTEM," filed Jul. 1, 2020, each of which is hereby incorporated herein by reference in its entirety and made part of the present U.S. Utility Patent Application for any and all purposes.

BACKGROUND OF THE INVENTION

Technical Field of the Invention

This invention relates generally to digital imaging and more particularly to compensating for light source distortion using spectral sensors with interference-based filters.

Digital imaging has had a profound effect on the quality and availability of camera technology. At the same time, the expectations of camera consumers have become ever more demanding, especially for cameras embedded in modern smart phones. Automated white balancing, for example, has improved the quality of camera imaging by compensating for the distorting effects of various light sources on a cameras output.

Spectroscopy devices, which function by detecting and/or acquiring incident light relating to multiple ranges of wavelengths, can be used to provide spectral information to assist automated white balancing. Interference-based filters, such as Fabry-Perot filters, when used in conjunction with spectral sensors have been shown to be capable of providing information that can be used in a camera system to improve automated white balancing.

BRIEF DESCRIPTION OF THE SEVERAL VIEWS OF THE DRAWING(S)

FIG. 1 provides a top-down illustration of an example optical sensor overlaid with filters in accordance with the present invention;

FIG. 2 provides a side illustration of adjacent Fabry-Perot filters with different cavity thicknesses for an image sensor in accordance with the present invention;

FIG. 3 provides a side illustration of a pair Bragg stack mirrors in accordance with the present invention;

FIG. 4 provides an illustration of interference filters and near infrared (NIR) filters combined to filter wavelengths in the infrared and visible spectrum in accordance with the present invention;

FIG. 5 provides a top-down illustration of a filter mosaic pattern for a spectral sensor in accordance with the present invention;

FIG. 6 provides another top-down illustration of a filter mosaic pattern for a spectral sensor in accordance with the present invention;

FIG. 7 provides another top-down illustration of a filter mosaic pattern for a spectral sensor in accordance with the present invention;

FIG. 8 provides a top-down illustration of an image sensor with a standard RGB mosaic pattern with one of the sensors replaced by a spectral filter element in accordance with the present invention;

FIG. 9 provides a cross-section of adjacent Fabry-Perot filters overlaid by a fiberoptic plate in accordance with the present invention;

FIG. 10 provides across-section of adjacent Fabry-Perot filters above light pipes in accordance with the present invention;

FIG. 11 provides a cross-section of adjacent Fabry-Perot filters with a light shield to isolate adjacent filters from crosstalk in accordance with the present invention;

FIG. 12 provides a cross-section of adjacent Fabry-Perot filters with a trench used to isolate adjacent filters from crosstalk in accordance with the present invention;

FIG. 13 provides a top-down illustration of a filter array with a shield grid in accordance with the present invention;

FIG. 14 provides a cross-section of adjacent Fabry-Perot filters with an isolation space between adjacent optical sensors in accordance with the present invention;

FIG. 15 provides an illustration of a filter structure that mirrors like filter bands in adjacent filter mosaics in accordance with the present invention;

FIG. 16 provides an illustration of color matching functions for the CIE XYZ standard observer in accordance with the present invention;

FIG. 17 provides a top-down illustration of a CIE/XYZ mosaic structure in a Bayer pattern in accordance with the present invention;

FIG. 18A provides a cross-section of adjacent Fabry-Perot filters overlaid by an optical angular element in accordance with the present invention;

Figure 18A:
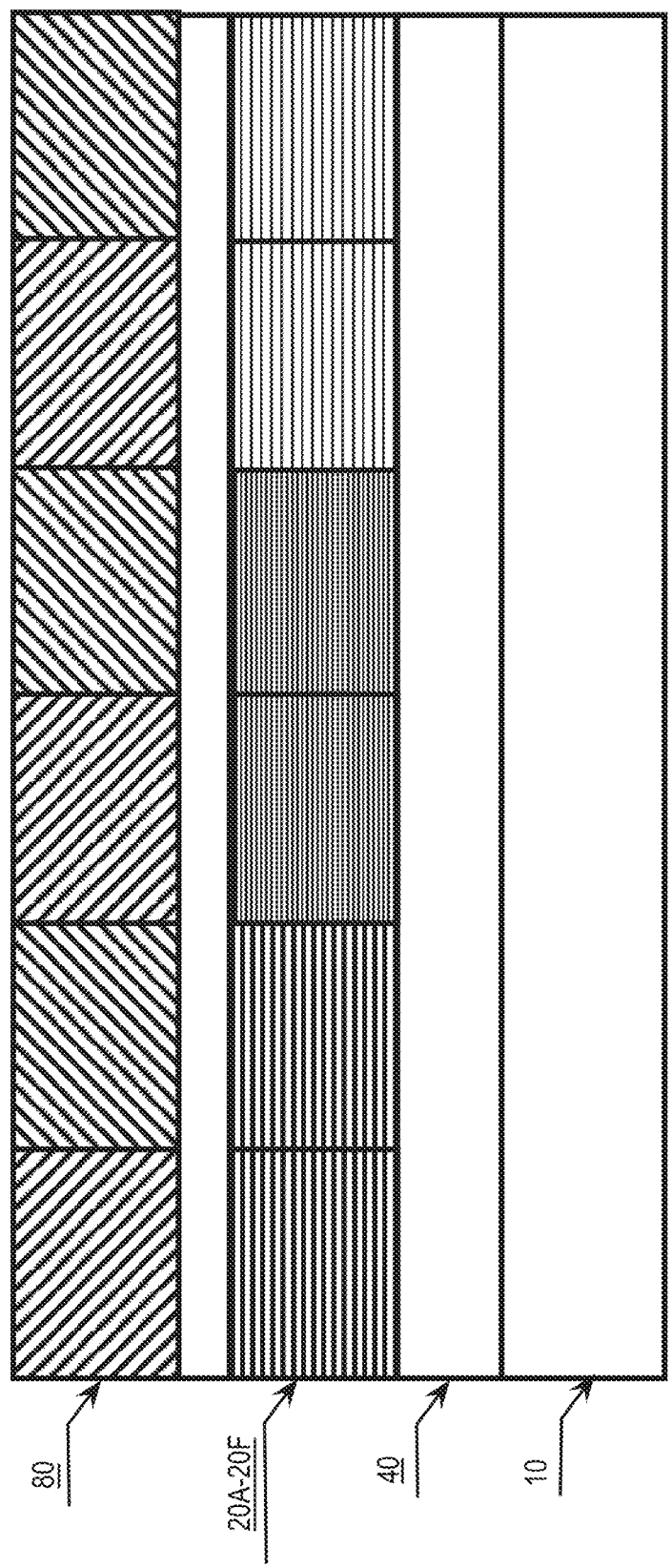
FIG. 18B illustrates a single optic is positioned over a sub-array of a filter array in accordance with the present invention.
FIG. 18C illustrates 3 optics is positioned over a different sub-array of a larger filter array in accordance with the present invention.
Figure 18C:
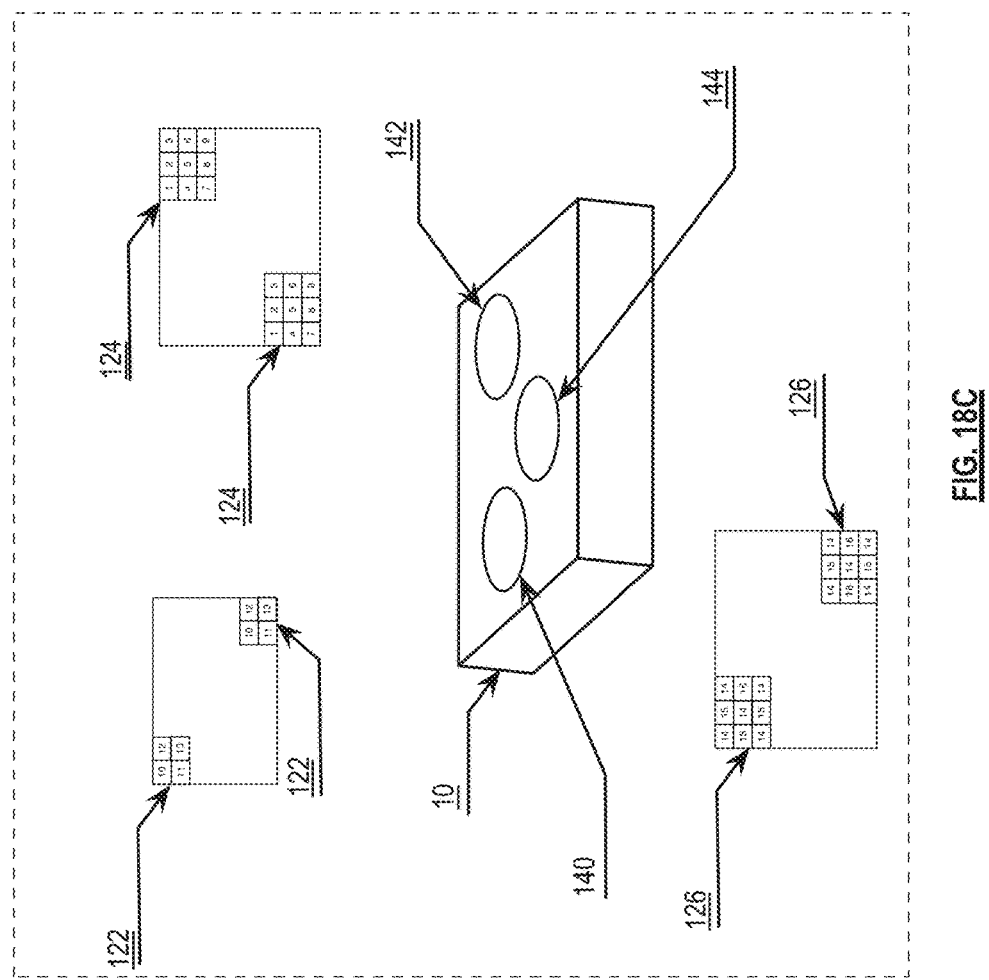
Figure 18B:
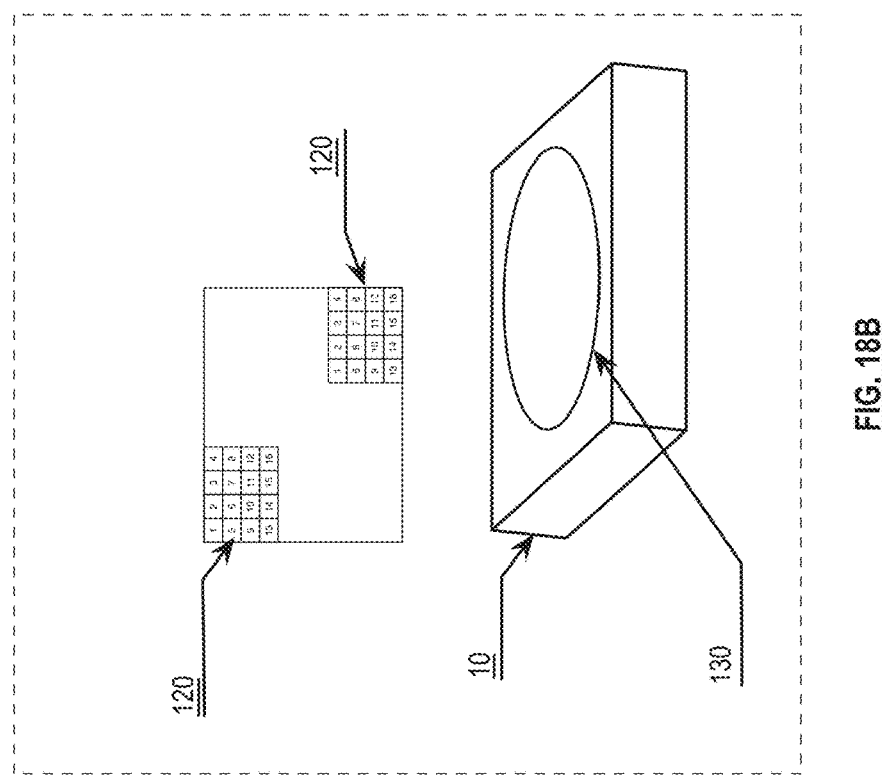
Figure 18D:
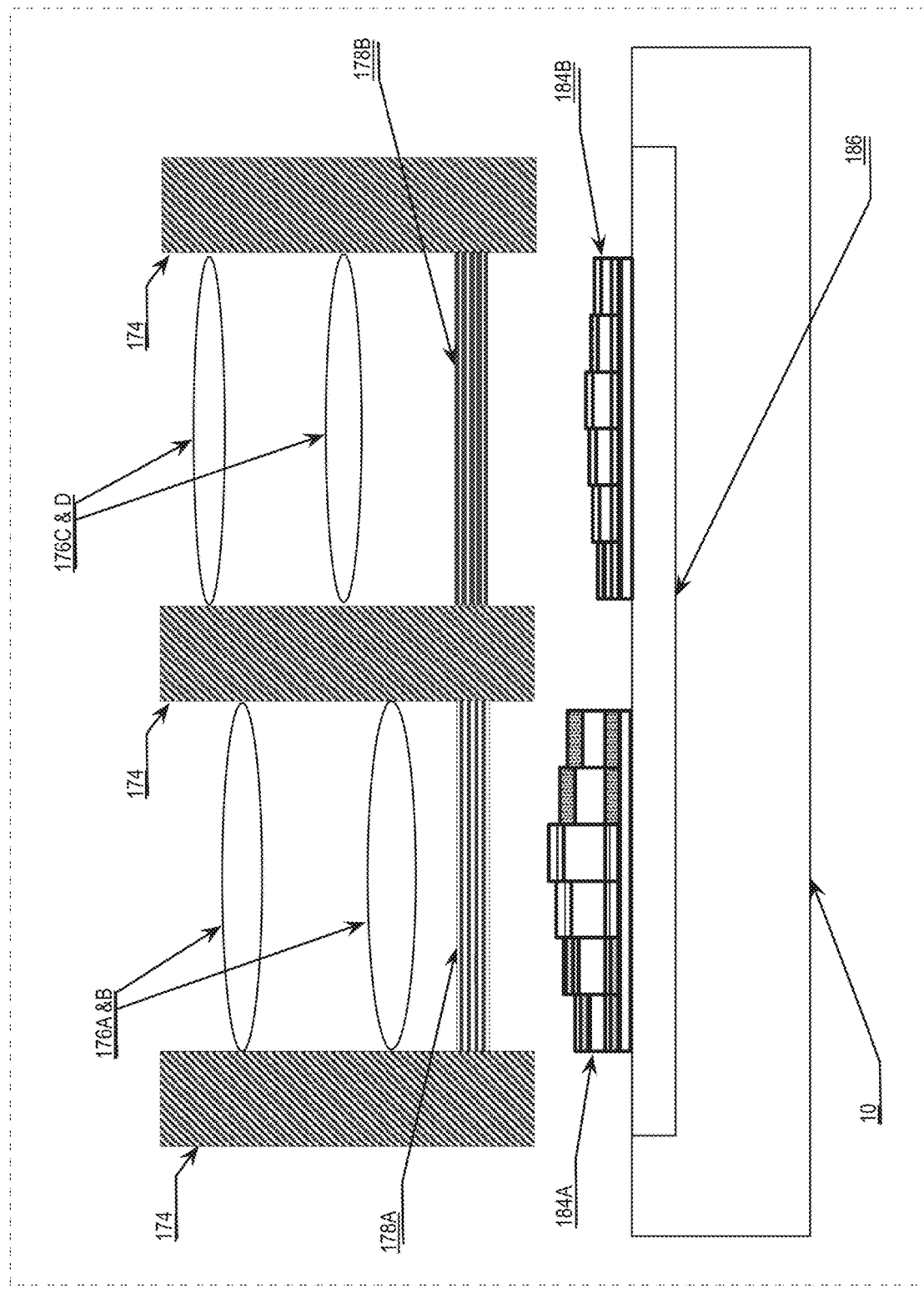
Figure 21:
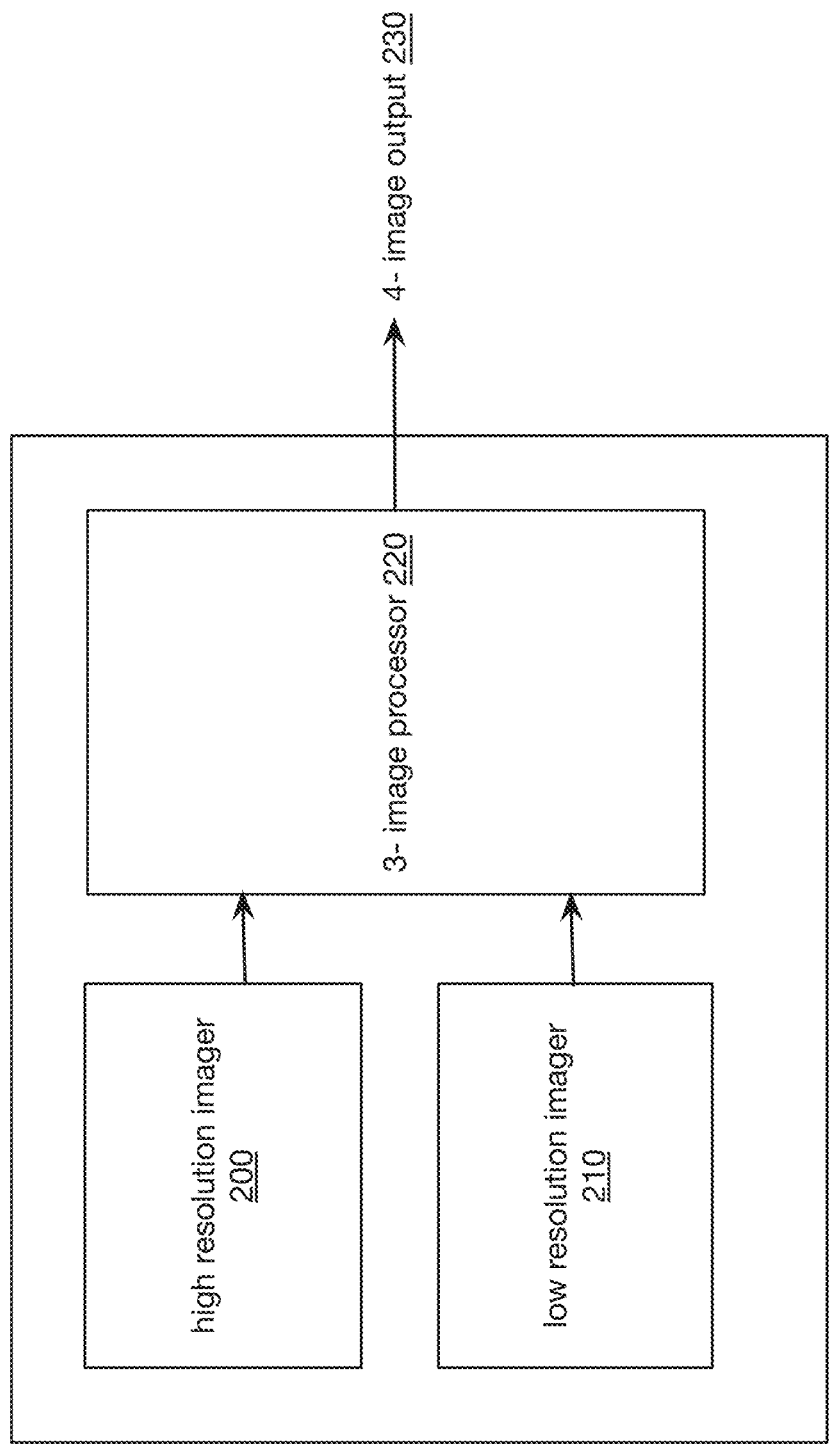
Figure 24:
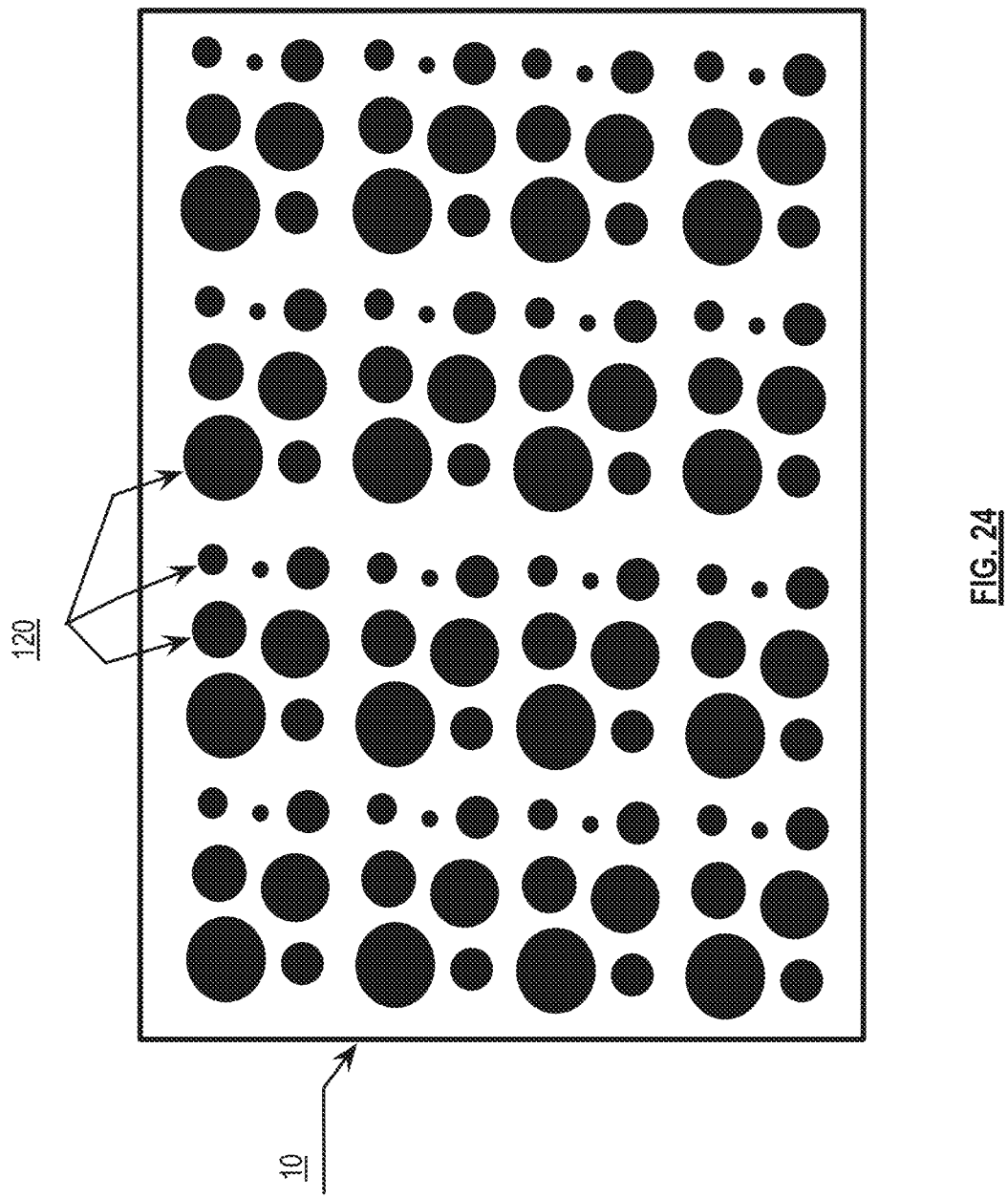
Figure 25:
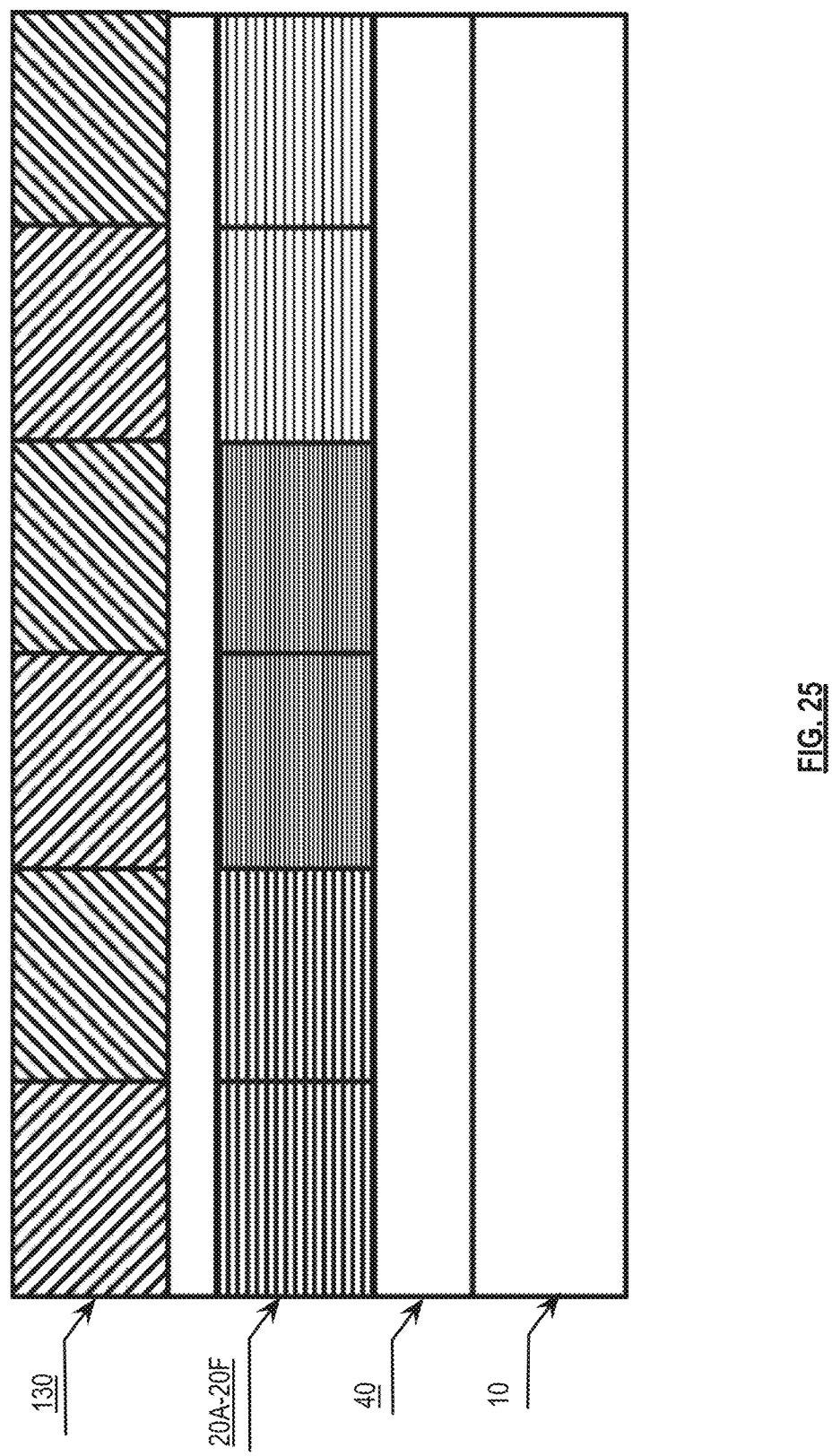
Figure 26:
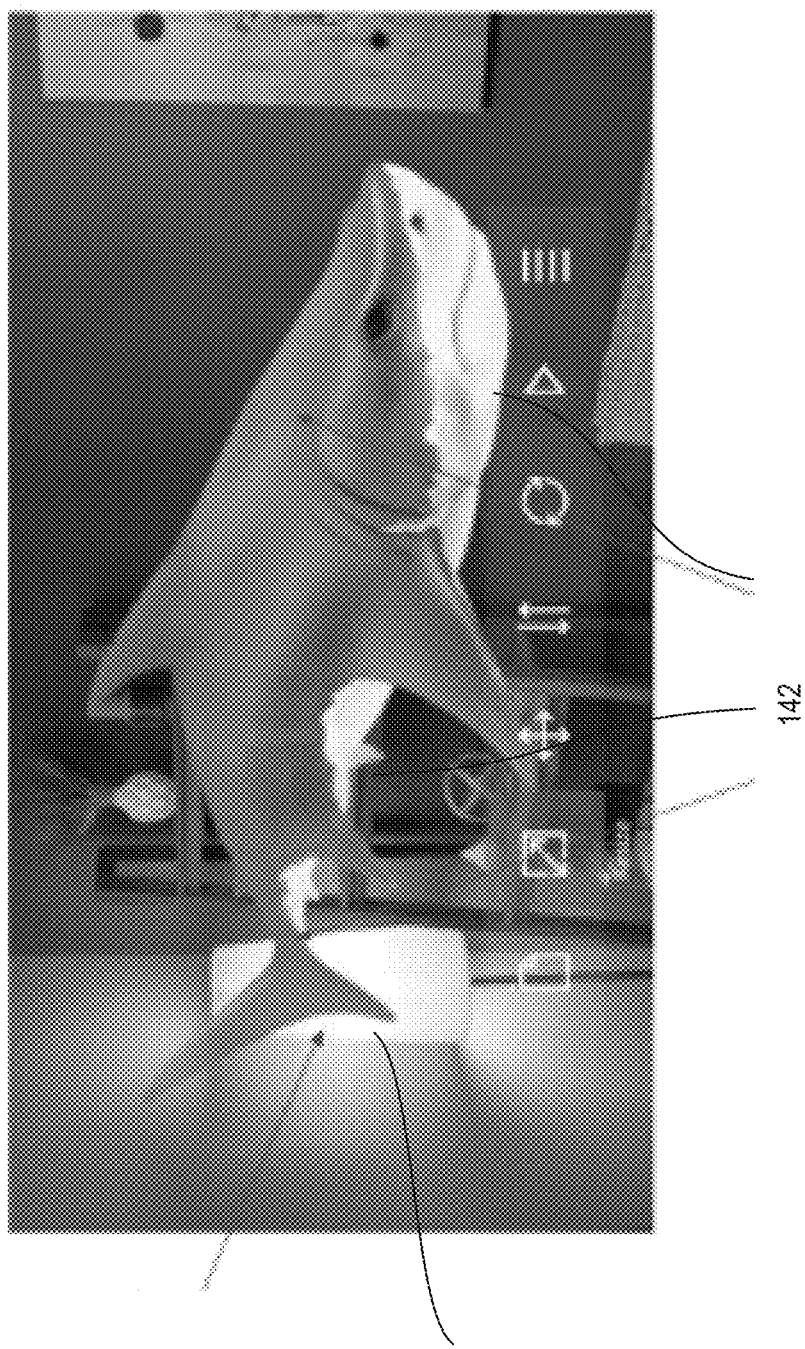
Figure 27:
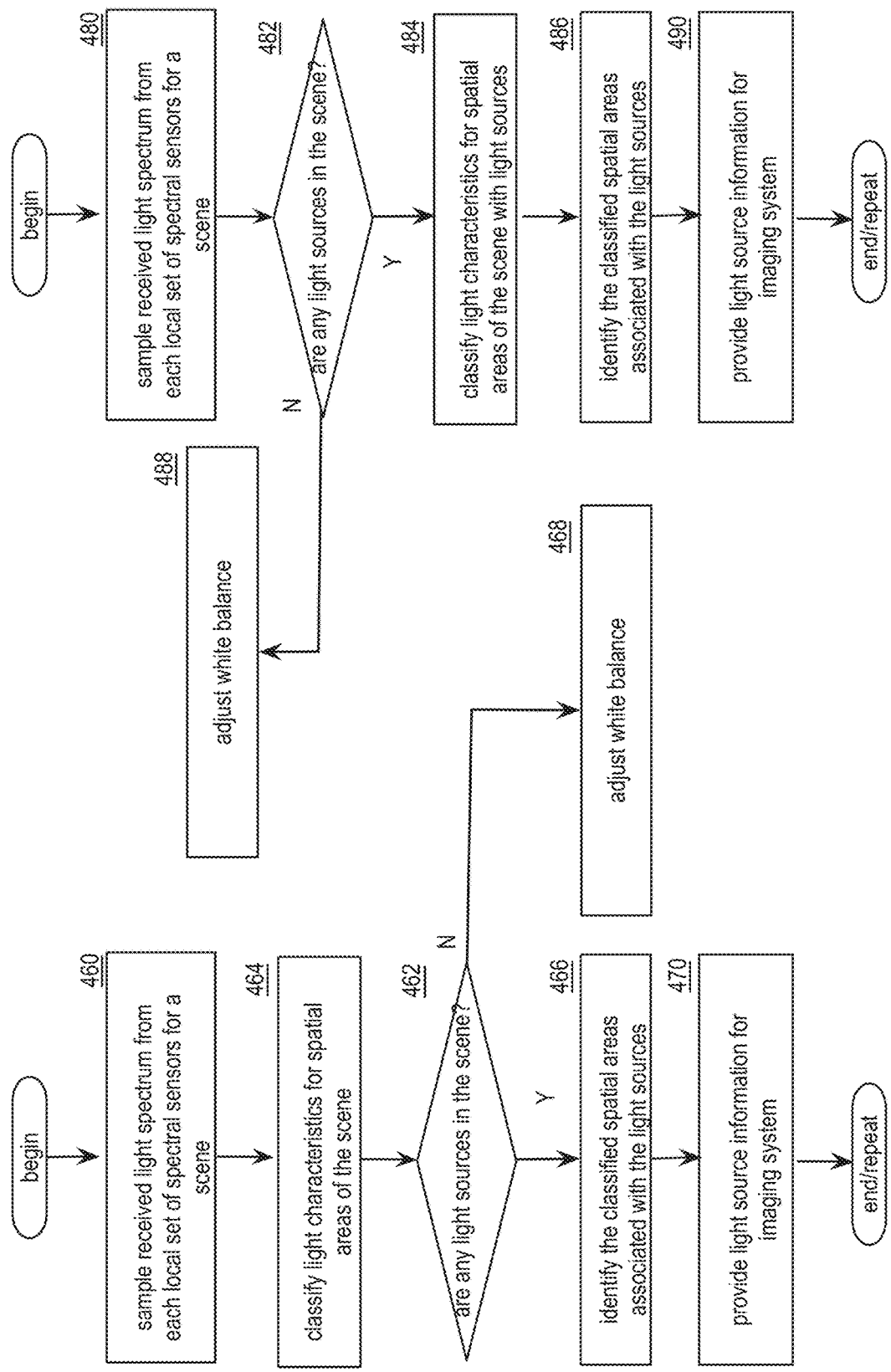
Figure 28:
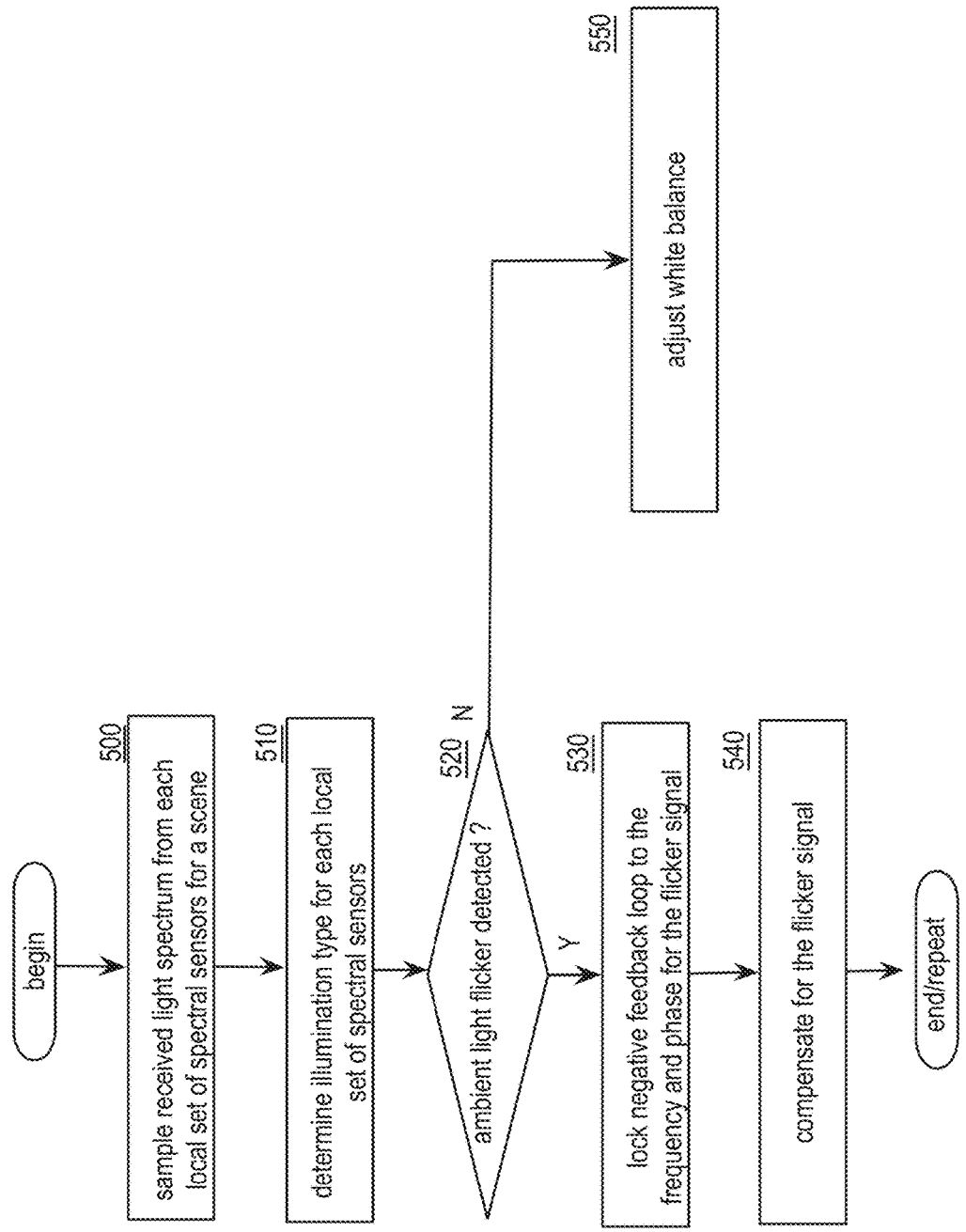

FIG. 18D provides a cross-section of interference filter sub-arrays with associated optics in accordance with the present invention;

FIG. 19A illustrates an imaging system incorporating a high-resolution and a low-resolution imager in accordance with the present invention;

FIG. 19B illustrates an imaging system incorporating a high resolution with two low-resolution imagers in accordance with the present invention;

FIG. 20 provides a top-down illustration of a pixel array with adjacent filter mosaics on a sensor in accordance with the present invention;

FIG. 21 provides a block diagram of an imaging system incorporating a high-resolution image and a low-resolution imager in accordance with the present invention;

FIG. 22 is a flowchart illustrating an example method for correcting light distortion in accordance with the present invention;

FIG. 23 is a flowchart illustrating another example method for correcting light distortion in accordance with the present invention;

FIG. 24 provides a top-down view of an optical sensor system using optical sensors/detectors comprising nanoscale semiconductor materials in accordance with the present invention;

FIG. 25 provides a cross-section of adjacent Fabry-Perot filters overlaid by an optical angular element in accordance with the present invention;

FIG. 26 illustrates a scene with one or more light sources;

FIG. 27A is a flowchart illustrating an example method for collecting light source information from a digital image of a scene in accordance with the present invention;

FIG. 27B is another flowchart illustrating an example method for collecting light source information from a digital image of a scene in accordance with the present invention;

FIG. 28 is a flowchart illustrating an example method for compensating for ambient light flicker in a scene being captured by a digital imaging system in accordance with the present invention;

FIG. 29A illustrates the separate spectral responses for two spectral sensors (pixels) having adjacent central wavelengths;

FIG. 29B illustrates the combined spectral responses for the two spectral sensors;

FIG. 29C illustrates a pair of adjacent interference filters each associated with an optical sensor in accordance with the present invention;

FIG. 29D illustrates a pair of adjacent interference filters associated with a single optical sensor in accordance with the present invention; and FIG. 29E illustrates a pair of interference filters placed one atop the other and associated with a single optical sensor.

DETAILED DESCRIPTION OF THE INVENTION

In various embodiments, spectral image sensors are combined with spectral filters such as interference-based interference filters to provide spectral information about a scene and/or light source. In some embodiments, spectral imaging of a scene can be performed and in other embodiments spectral imaging of a scene can either be combined with high resolution imaging in a single imager, or separate imagers combined after an image is collected. In further embodiments, interference-based filters can be implemented using Fabry-Perot filters integrated with spectral image sensors, such as CMOS-based sensors, to provide small-scale spectral image sensor systems. In some embodiments, small-scale spectral imaging systems can be adapted for use in applications that require white balance correction. Examples of applications include, but are not limited to, smart mobile phones, high resolution cameras, video cameras, security cameras, calibration systems, inspection systems and certain industrial applications.

Compensating for light source distortion, sometimes called "white-point balancing" is a fundamental part of a camera's rendering of images. Without white-point balancing an image sensor will not accurately represent the expected colorimetry of a recorded scene or object. Various light sources distort the colorimetry of objects in an image sensor's field of view. For example, incandescent lights, fluorescent lights and light emitting diodes (LEDs) each distort the light that an image sensor "sees". Other light sources, such as sodium street lights, distort an image sensor's output sufficiently that most colors are almost virtually impossible to distinguish.

White balance compensation has provided the impetus for steady progress, eventually resulting in automatic white-balancing, which allows photographers to compensate for color imperfections resulting from light sources at the output of an image sensor itself. In one example, an RGB optical sensor, which is a semiconductor device that contains three types of pixels with peak sensitivity in the red, green and blue parts of the visible light spectrum, has been used to provide a reference for automatic white-balancing. The combination of the red green and blue wavelengths of an RGB sensor appear to an observer to be "white", thus in a scene containing one or more substantially white objects, the RGB sensor can combine the red green and blue wavelengths to appear to an observer as white. Accordingly, in a scene containing such a substantially white object, the RGB sensor can use the white object as a reference point for adjusting the treatment of any other colors in a scene. AWB has evolved from combining the output of an RGB sensor on the camera to use as a reference for white balancing to include multi-channel spectral sensors. The accuracy of these multi-channel spectral sensors improve as more channels are distributed across the visible light spectrum, however, in each case an imager with a multi-channel spectral sensor is limited to a single average reference spectrum to use for AWB of a given scene. Accordingly, in circumstances where multiple light sources are present, or where a scene is dominated by a single object, an image sensor can only compensate for the "average" illumination of a particular scene.

Figure 1:
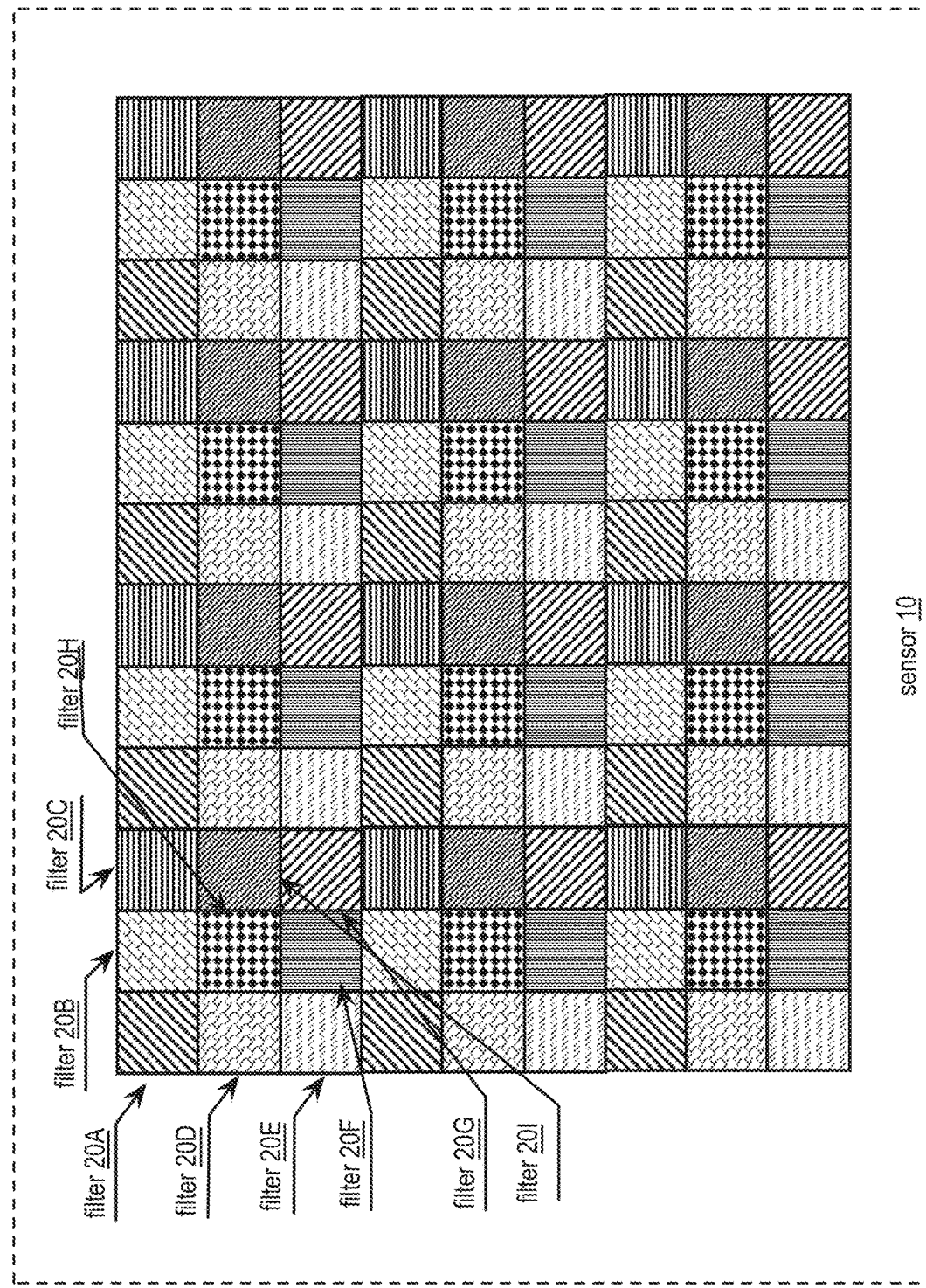

FIG. 1 provides a top-down illustration of a spectral sensor with filters provisioned in a 3×3 patterns of 9 spectral bands each across an imager array. In the example, Fabry-Perot filters with different center wavelengths are patterned across the spectral sensor as a mosaic structure repeated across the array. In other embodiments, the 3×3 filter pattern can be replaced with other patterns, such as a 2×2 pattern, a 4×4 filter pattern, a 5×5 filter pattern or a 3×4 pattern, etc., as dictated by resolution and/or manufacturing requirements. In an example, a 3×3 pattern of filters provides 9 different cavity thicknesses, which are then repeated across an example sensor array. In the example of FIG. 1 each of the 9 filter thicknesses (illustrated as filters 20A-20H, etc.) is repeated 12 times across the 12×9 array of optical pixels on sensor 10.

In the sensor system based on FIG. 1 optical pixels for sensor 10 are disposed on an integrated circuit with a plurality of sets of interference filters manufactured on top of the optical pixels. In an example, a set of nine (9) interference filters 20A-20I are arranged in a mosaic pattern, each of which is configured to pass light in a different wavelength range. In an example, each set of interference filters is aligned to at least a set of optical sensors, such that each set of optical sensors is able to sense a localized bandpass response with 9 channels. The set of optical sensors and filter arrangement are then repeated across the array, enabling the optical sensor array to provide multiple measured light spectra spatially separated across different areas of an image sensor. As used herein, an individual optical sensor corresponds to a pixel (pixel=smallest addressable element), where a pixel is a photodiode. Accordingly, "optical sensor", "optical pixel" and "pixel" are used interchangeably.

In an example, the image sensor of FIG. 1 is able to provide light distortion information for different areas of the image sensor, allowing white-balance correction to be extended to each of those areas. In an example of implementation, a sensor system for imaging a scene can comprise a plurality of optical sensors on an integrated circuit, with a plurality of sets of interference filters, such as filter elements 20A-20I of FIG. 1. In the example, each set of interference filters of the plurality of sets of interference filters can include a plurality of interference filters arranged in a pattern, where each interference filter of the plurality of filters is configured to pass light in a different wavelength range. In an example, each set of interference filters of the plurality of interference filters is associated with a spatial area of the scene and a spectral response can thus be determined for each spatial area of the scene.

In an example of implementation referring to FIG. 1, a set of interference filters of a plurality of sets of interference filters can be spatially separate from others of the plurality of sets of interference filters and in another example, each set of interference filters of the plurality of sets of interference filters can spaced randomly between the plurality of optical sensors of sensor 10.

Figure 2:
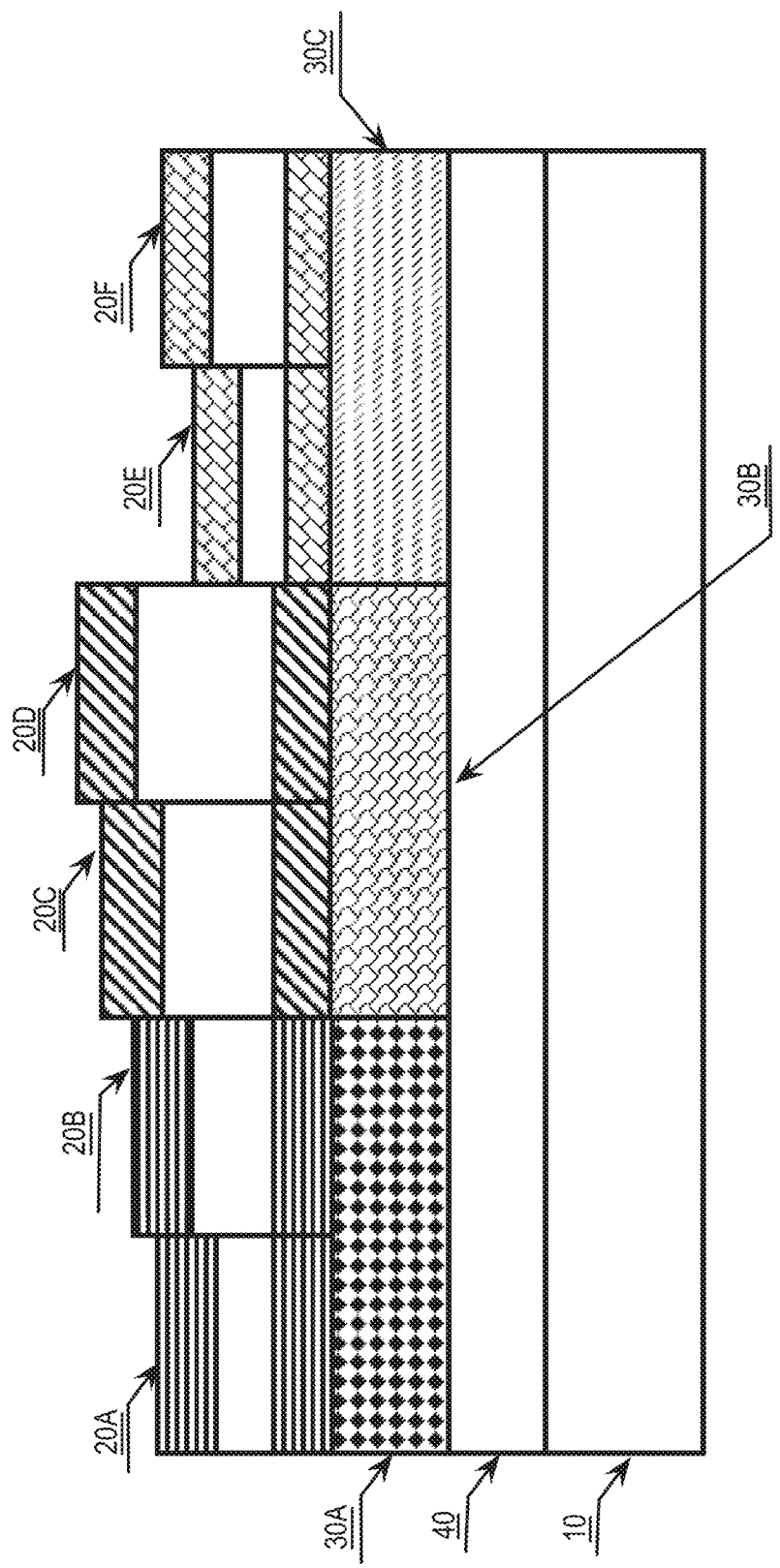

FIG. 2 provides a cross-section of adjacent Fabry-Perot filter stacks (filters) with different cavity thicknesses for an image sensor, such as, for example, the image sensor of FIG. 1. As illustrated, the center wavelength of each Fabry-Perot filter is determined in first order by the cavity thickness between its upper and lower mirror. In the example, adjacent filters 20A-20F provide 6 channels of sensor output. Between filters 20A-20F and sensor 10, rejection filters 30A—30C are provided to block stray light outside the desired wavelengths of the associated interference filters. In some circumstances a Fabry-Perot filter may pass wavelengths, such as harmonic wavelengths or wavelengths outside the valid range of the (Bragg) mirrors, that will negatively impact the desired wavelength response of the filter. Accordingly, a rejection filter can act as a bandpass filter, rejecting wavelengths outside of the bandpass range. In an example, a single rejection filter may provide sufficient bandpass rejection for two or more Fabry-Perot filters. In another example, rejection filters can be disposed above the associated Fabry-Perot filters to reject light outside of the desired wavelength range before it can be passed by the Fabry-Perot filters. In yet another example, additional interference filters, such as Fabry-Perot filters, can be disposed between one or more rejection filters and the sensor 10. In the example, filters 20A-20F overlay one or more rejections filters, with the additional interference filters underlaying the one or more rejection filters.

In an example, rejection filters can comprise organic material and can be applied using a spin-on process. In another example, rejection filters can comprise plasmonic interference filters applied by, for example, a lithographic process. In another example, rejection filters may be colloidal or quantum dot-based filters. Other examples of rejection filters include a combination of organic materials and/or plasmonic filters. And in yet another example, a rejection filter may comprise one or more interference filters, either alone or in combination with organic materials and/or plasmonic filters. In an example, a plurality of rejection filters can be arranged in a pattern under a mosaic of filter elements, where each rejection filter of the plurality of rejection filters is configured to substantially reject light of predetermined wavelengths.

In a specific example of implementation, a set of interference filters is arranged in a pattern that further includes a plurality of organic filters and in another example, the pattern includes a plurality of non-interference filters, wherein the non-interference filters are selected from a group that consists of organic filters, plasmonic filters or a suitable alternative.

Figure 3:
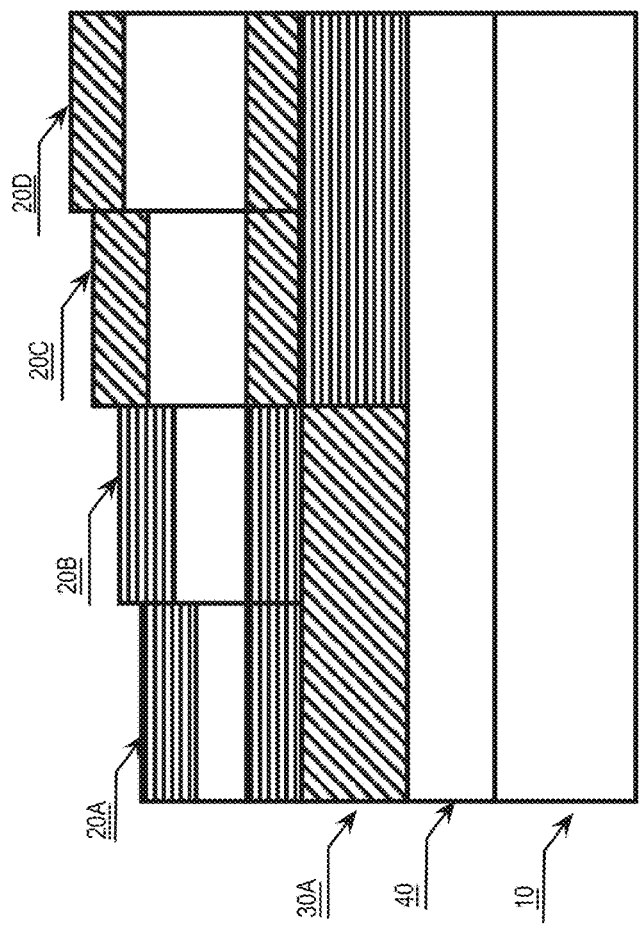

In a related example, a rejection filter can comprise a Bragg stack mirror. In the example illustrated in FIG. 3, a Bragg stack mirror acts as a rejection filter for Filter 20A and 20B, while acting as the Bragg stack mirror from the Fabry-Perot filters 20C and 20D in FIG. 3. In yet another example, one or more of the rejection filters can comprise multiple thin layers of dielectric material, deposited and patterned, for example using a thin film deposition process and/or lithographic process. Accordingly, the patterning process can consist of lithographic treatment to define the filter spatial positions, combined with etching or lift-off techniques to remove deposited filter layers locally. Specific etch-stop layers may be deposited in the filter stack to control etch processes, allowing removal of optical layers in the filter stack locally. In an example, an etch-stop layer that does not affect optical performance may be used to protect filter 20A and 20B from being etched away while filter material from other locations is being removed. An etch-stop can be used when defining the bandpass filters as well as the rejection filters.

In a specific example of implementation, one or more rejection filters of a plurality of rejection filters is another interference filter. In the example, the another interference filter is one of the plurality of interference filters. In another example, the other interference filter is at the same time configured to pass light in a particular wavelength range and reject light for another optical sensor and interference filter pair.

Figure 4:
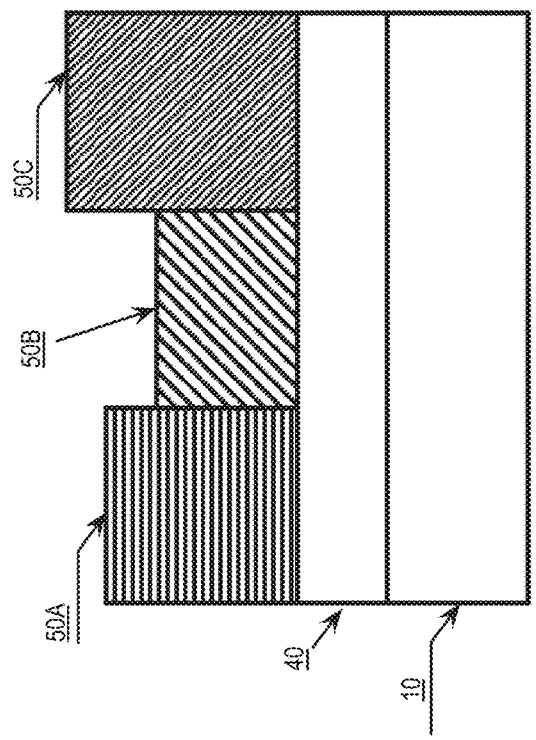

FIG. 4 provides an illustration of interference filters used for filtering visible light and combined with near infrared (NIR) filters to filter wavelengths in the infrared spectrum. In an example, one or more NIR filters can be composed of organic materials, while the interference filters comprise Fabry Perot filters, allowing the measurement of light wavelengths across the visible and infrared spectrum. In the example of FIG. 4, filters 50A-50C can be any of Fabry-Perot filters, organic filters or any other acceptable alternative.

In an example, non-CMOS based optical sensors can be used to extend the spectral range of a spectral sensor to infrared wavelengths. For example, colloidal or quantum dot-based optical sensor may be used to collect infrared light, for example in the short-wave infrared range. In the example of a quantum dot-based optical sensor, the optical sensors may be optimized by tuning the quantum dot size, such that a predefined wavelength is selected, so that the optical sensor provides an infrared filter channel. In another example, a sensor system can include a plurality of sets of optical sensors, wherein each set of optical sensors is arranged in a pattern that includes at least one optical sensor that is respectively larger in size than at least one other optical sensor of the set of optical sensors.

Figure 5:
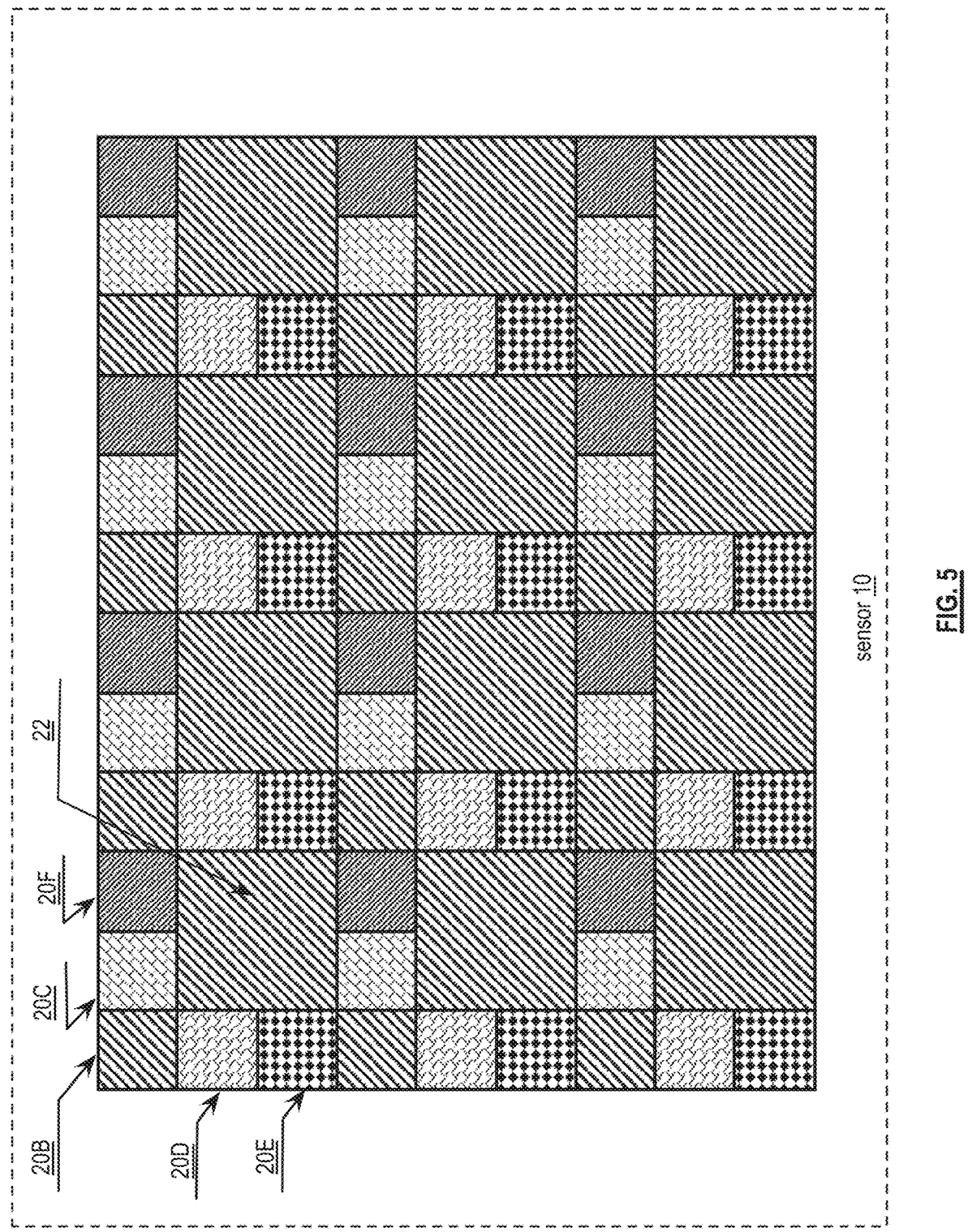

FIG. 5 provides a top-down illustration of a filter mosaic pattern for a spectral sensor that includes a large filter element. In the example, a 6-filter mosaic includes standard filter elements 20B, 20C, 20D and 20E with a single filter element 22 that occupies the space of 4 standard filter elements. In an example, the larger filter element 22 can provide for a 6-channel filter response in situations where some filter response requirements dictate increased light capture, such as when a wavelength range requires a filter with reduced transmission properties. In a specific example, a set of interference filters can be arranged in a pattern that further includes an interference filter that is respectively larger in size than at least one other interference filter in the set of interference filters.

FIG. 6 provides a top-down illustration of another filter mosaic pattern for a spectral sensor that includes filter elements forming larger oblong shapes. In the example, large filter element 24A and large filter element 24B are included in a filter mosaic with 16 standard filter elements, such as filter elements 20A-20D. In an example, the inclusion of larger filter elements can provide for a 19-channel filter response in situations where some filter response requirements dictate increased light capture, such as referenced with reference to FIG. 5. In an example, a spectral filter mosaic can include an interference filter that is respectively larger in size than at least one other interference filter in the set of interference filters and/or is in an elongated rectangular shape.

FIG. 7 provides a top-down illustration of a filter mosaic pattern for a spectral sensor with filter elements forming progressively smaller rings around a central filter element. In the example, smaller filter element 26D, is surrounded by larger filter element 26C, which is surrounded be an even larger filter element 26A, all of which are surrounded by large filter element 26B. In an example, the progressively larger filter elements can provide for a 4-channel filter response in situations where some filter response requirements dictate increased light capture, such as referenced with reference to FIG. 5. In an example spectral filter mosaic, one or more interference filters are respectively larger in size than at least one other interference filter in the set of interference filters and/or is adapted to form a ring around the other interference filters in the set of interference filters.

FIG. 8 provides a top-down illustration of an image sensor with a standard RGB mosaic pattern with one of the sensors replaced by a spectral filter element. In the example, pixel sensors 20A, 20B and 20C form a 2×2 mosaic pattern that includes filter 32A (1). In an example, the standard RGB mosaic pattern is repeated across sensor 10, with each 2×2 RGB mosaic including a spectral filter element, such as filter elements 32B and 32C of a multi-band spectral sensor. For example, the sensor 10 of FIG. 8 is an 8×8 array of sensors with 4×4 RGB mosaics that include 4×4 spectral sensors. Accordingly, in the example of FIG. 8, the standard 16 RGB array can include 16 spectral sensor channels for the sensor 10. In an example, the RGB and spectral sensor combination can be repeated across the spatial area of sensor 10 to provide localized spectral response for a large image sensor.

In an example of implementation, A sensor system can include a plurality of sets of optical sensors on an integrated circuit, where each set of optical sensors includes a plurality of optical sensors arranged in a pattern. In the example, one or more sets of interference filters, each of which includes a plurality of interference filters, each interference filter is located on top of an optical sensor of the plurality of a sets of optical sensors and each interference filter of a set of interference filters is configured to pass light of a different wavelength range. In a specific example, the pattern for the set of optical sensors includes 4 sections to form a 2×2 matrix, where each of a red, green and blue channel sensor and a spectral channel sensor is located in one of the 4 sections.

In a specific example of implementation, the pattern for the red, green and blue channel sensors is a 2×2 pattern, while the pattern for the spectral sensors uses a repetition rate of N, where N>2 and the number of different spectral sensors N>1. In another example, each color channel filter element and/or spectral channel filter for a sensor system covers more than one optical sensor in the pattern. In yet another example, a filter pattern includes a set of color filters intended for color imaging (such as red, green, blue, luminance, clear, etc.), such as that found in any modern imager and at least one set of spectral filter elements.

In an example, different spectral filters of several of the patterns together form a low-resolution spectral image of a scene, while the color filters of the pattern form a high-resolution color image of the scene. In a related example, the low-resolution spectral response is used to determining the white balance requirements of different spatial areas of the scene.

In a specific example of implementation, each interference filter of a set of interference filters is associated randomly with a spectral channel sensor and in another example, the number of interference filters in each set of interference filters is different based on the spatial location of the set of interference filters in the sensor system. In yet another related example, the location of each set of interference filters and/or each interference filter in a spectral imager is based on a pseudo random pattern.

Figure 9:
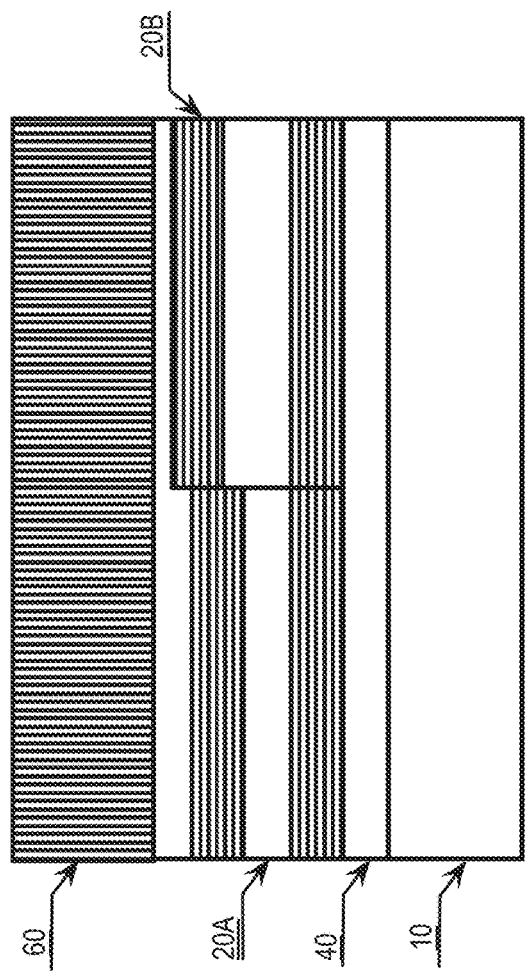

FIG. 9 provides a cross-section of adjacent Fabry-Perot filters 20A and 20B overlaid by a fiberoptic plate 60. Referring back to FIG. 2, light passing through a filter, such as filter 20A of FIG. 2, at particular angles can be filtered by a particular filter while being detected by an optical sensor associated with an adjacent filter. In a specific example, filter 20A is configured to pass light of specific wavelengths, however, when the angle of incidence of the light passing through filter 20A is sufficiently oblique, the light can propagate through the integrated circuit back end 40 and be detected with an optical sensor associated with filter 20B. Light of an undesired wavelength propagating through an adjacent interference filter is often referred to as "crosstalk". Crosstalk has an undesired effect on the quality of the spectral response of a filter mosaic, which in turn negatively impacts the quality of light distortion corrections. Thus, eliminating or at least attenuating the effects of crosstalk is desirable.

Fiberoptic plate 60 of FIG. 9 is an optical device comprised of a bundle of micron-sized optical fibers. When used as a lens on filters 20A and 20B, light or an image transmitted through fiber optic plate is collimated to reduce the angle-of-incidence (the angle between a ray incident on a surface and the line perpendicular to the surface at the point of incidence) of passing through the filters sufficiently to reduce unwanted crosstalk. Unlike a normal optical lens, no focusing distance is required when using a fiber optic plate, such as fiber optic plate 60, accordingly it is compatible with compact optical devices.

Figure 10:
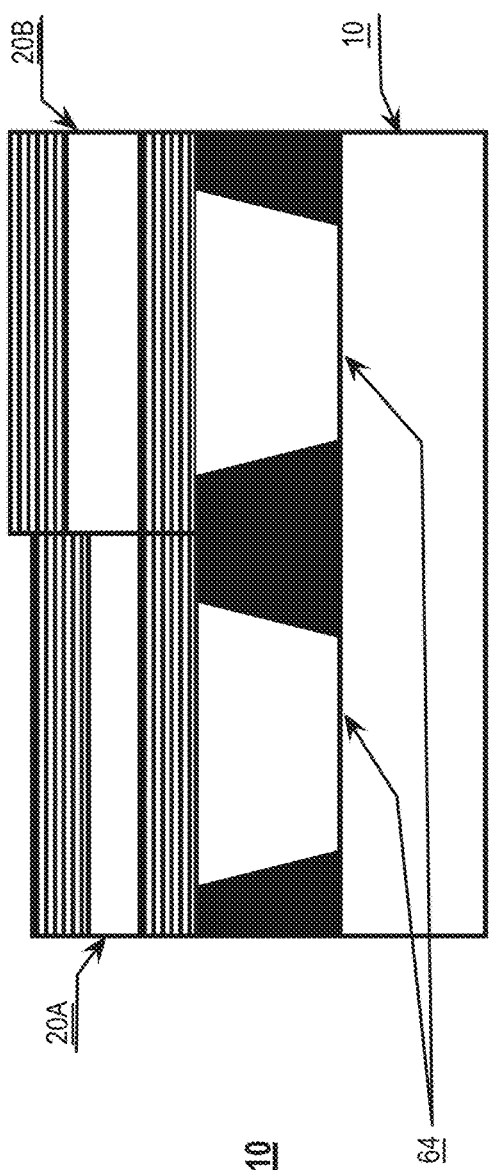

FIG. 10 provides another cross-section of adjacent Fabry-Perot filters 20A and 20B above light pipes 64. In the example of FIG. 10, light with too high angle-of-incidence passing through a filter is redirected by the side walls of light pipes 64 to the optical sensors associated with that filter. In a specific example, when the angle-of-incidence of light passing through filter 20A is sufficiently high, it will be reflected off the sidewall of light pipe 64 and be detected by an optical sensor associated with filter 20A. In an example, the angle of side walls of light pipes can be adjusted to provide a maximum attenuation while minimizing absorption of desired light wavelengths. In an example, light pipes 64 can be constructed of a variety of materials, where the light pipe itself is a material with relatively high light transmission, with the interstitial material being an opaque or semi-opaque material. In another example, the sidewalls of light pipes 64 can include a relatively high reflectivity material coated or deposited on it.

Figure 11:
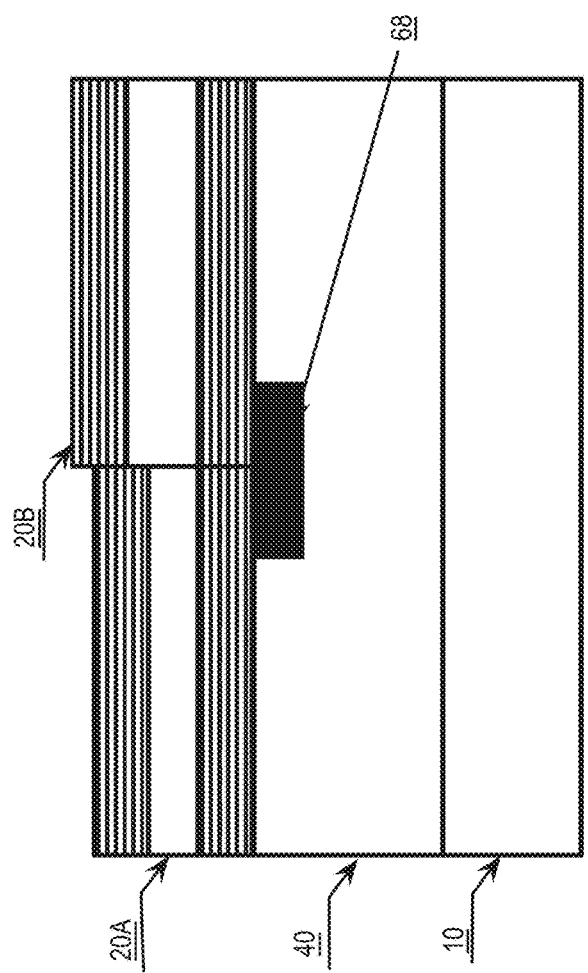

FIG. 11 provides another cross-section of adjacent Fabry-Perot filters 20A and 20B with a light shield 68 to isolate adjacent filters 20A and 20B from crosstalk. In the example of FIG. 11, light passing through filter 20A with excessive angle-of-incidence passing through a filter is deflected or blocked by light shield 68. In a specific example, when the angle-of-incidence of light passing through filter 20A is sufficiently high, it will either reflect off the side of light shield 68 or be blocked entirely, so that crosstalk to filter 20B will be eliminated and/or attenuated. In an example, light shield 68 can be constructed of a variety of materials, including opaque or semi-opaque material. In another example, the light shield 68 can be composed of metal, such as Al, or AlSi deposited in a trench formed and/or etched in the integrated circuit back end 40 prior to addition of filters and/or rejection filters. In a specific example of implementation, metal is deposited on the surface of integrated circuit back end 40 where trenches have been formed and then removed from the areas outside the trenches using a subtractive process, such as chemical mechanical polishing and/or dry etching using a lithographic process. In another example, the depth and width of light shield 68 can be adjusted to provide attenuation of particular angles-of-incidence for more or less crosstalk attenuation as warranted.

Figure 12:
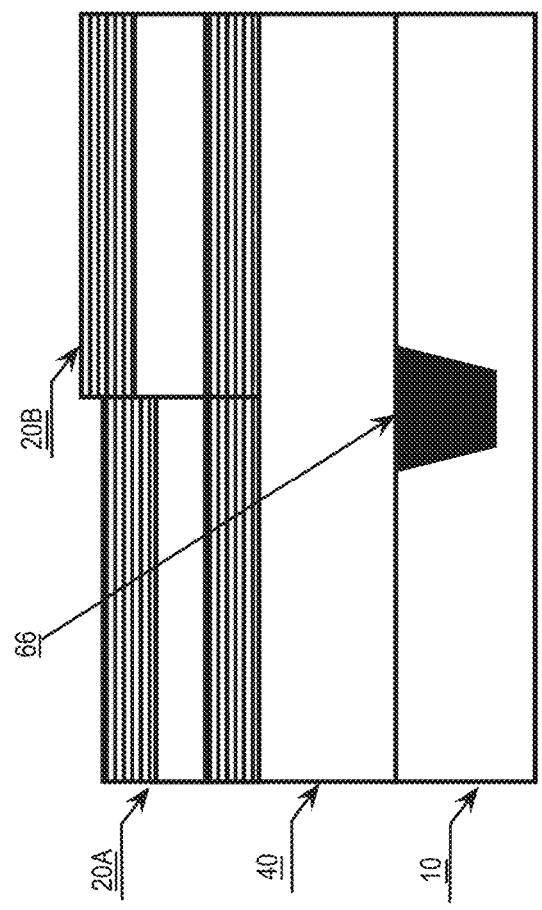

FIG. 12 provides another cross-section of adjacent Fabry-Perot filters 20A and 20B with a trench 66 used to isolate adjacent filters 20A and 20B from crosstalk. In the example of FIG. 12, light passing through filter 20A with excessive angle-of-incidence passing through a filter is deflected or blocked by trench 66. In a specific example, when the angle-of-incidence of light passing through filter 20A is sufficiently high, it will either reflect off the side of trench 66 or be blocked entirely, so that crosstalk to filter 20B will be eliminated and/or attenuated. In an example, trench 66 is formed and/or etched in the integrated circuit back end 40 prior to addition of filters and/or rejection filters using a lithographic process. In an example, trench 66 can be filled with another material or left as a void, with light being either reflected or refracted at the side walls of trench 66. In another example, the depth and width of trench 66 can be adjusted to provide attenuation of particular angles-of-incidence for more or less crosstalk attenuation as warranted.

Figure 13:
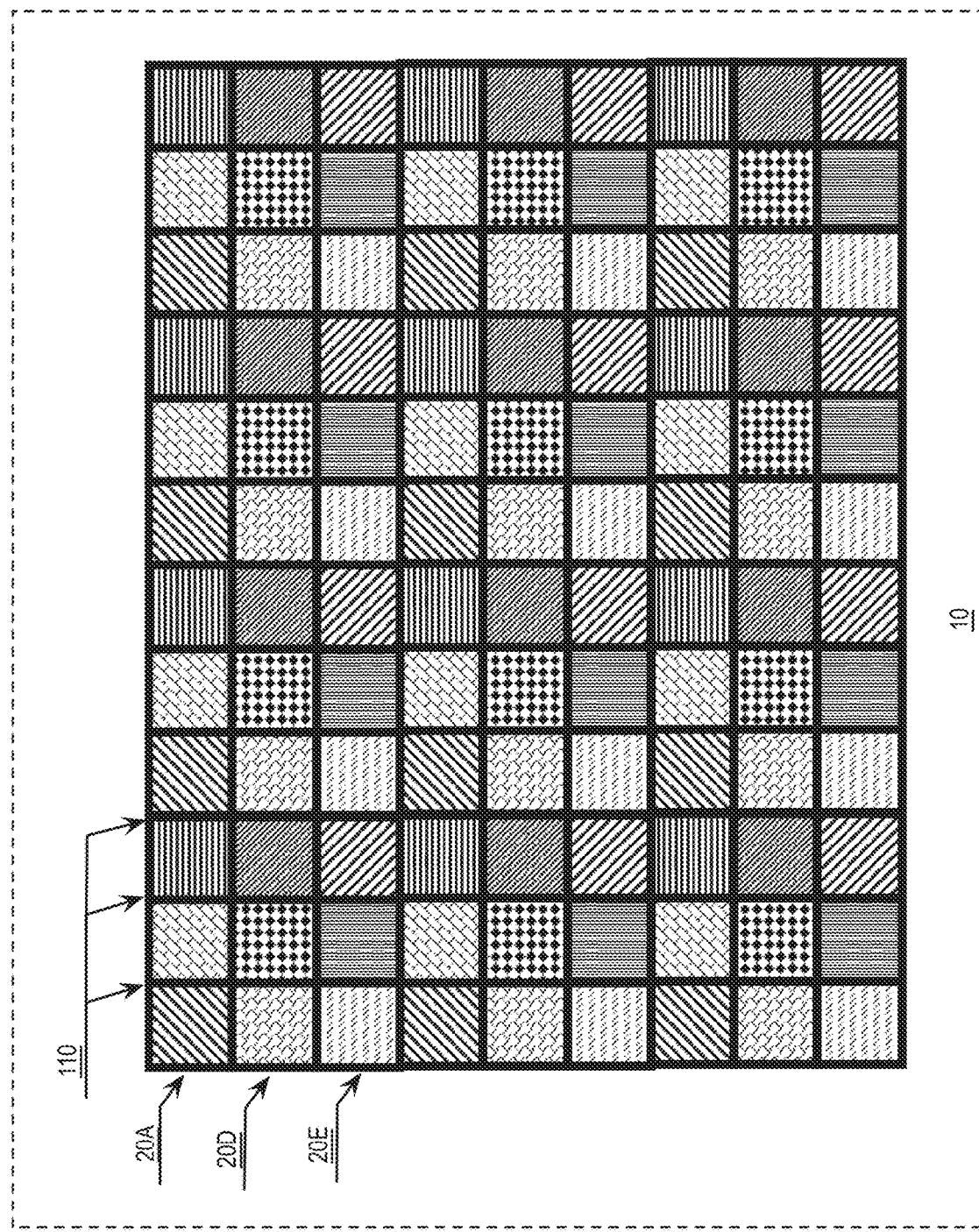

FIG. 13 provides a top-down illustration of filter array with a shield grid 110 to attenuate crosstalk between filter and optical sensor pairs. In the example of FIG. 13, incident light on filters 20A. 20D, 20E, etc. is blocked at shield grid 110 to provide a buffer zone between the filters, such that the filters are at least partially isolated from each other. In an example, shield grid 110 can be opaque material or semi-opaque material or any other sufficiently absorptive material deposited or defined lithographically in the margins of filters 20A. 20D, 20E, etc. In another example, shield grid 110 can be composed of a reflective material, such as Al and/or AlSi. In an example, shield grid 110 can be configured above or below filters 20A. 20D, 20E, etc.

Figure 14:
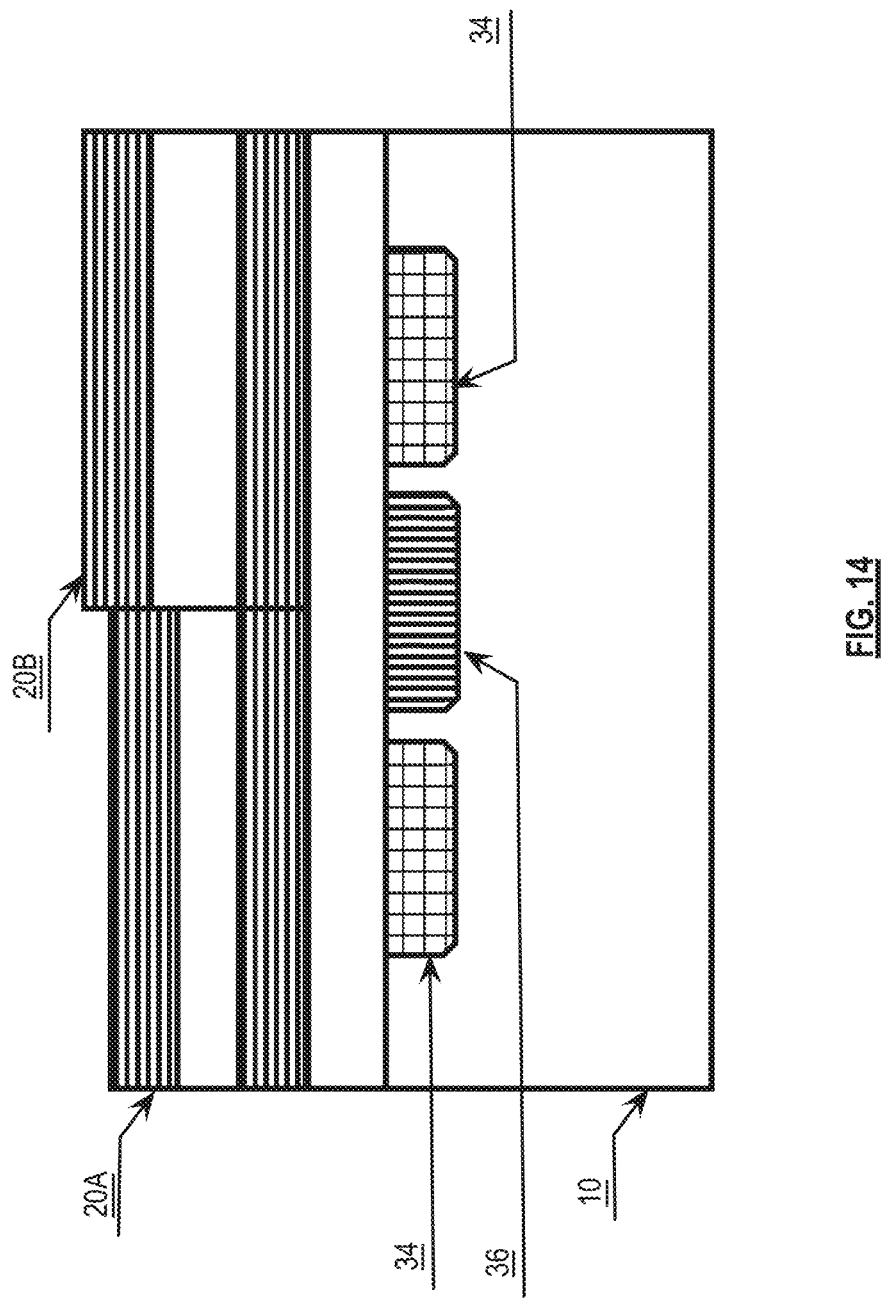

In certain embodiments, an image sensor, such as sensor 10 of FIGS. 9-13, can be configured to provide a dead space or void between individual optical sensors and/or optical sensor components of an image sensor. The dead space can provide isolation between the optical sensors to reduce crosstalk between the optical sensors. In a related example illustrated in FIG. 14, an intermediate element 36 is located under the intersection of adjacent filters 20A and 20B and between photosensitive elements 34. In an example, the intermediate element 36 is a dead space between optical sensors of an image sensor. In another example, the intermediate element 36 and photosensitive elements 34 are all located in the dead space between optical sensors of an image sensor. In a specific example of implementation, one or more responses from photosensitive elements 34 can be used to measure crosstalk and in a related example, one or more responses from photosensitive elements 34 can be used to correct the filter response for the measured crosstalk.

Figure 15:
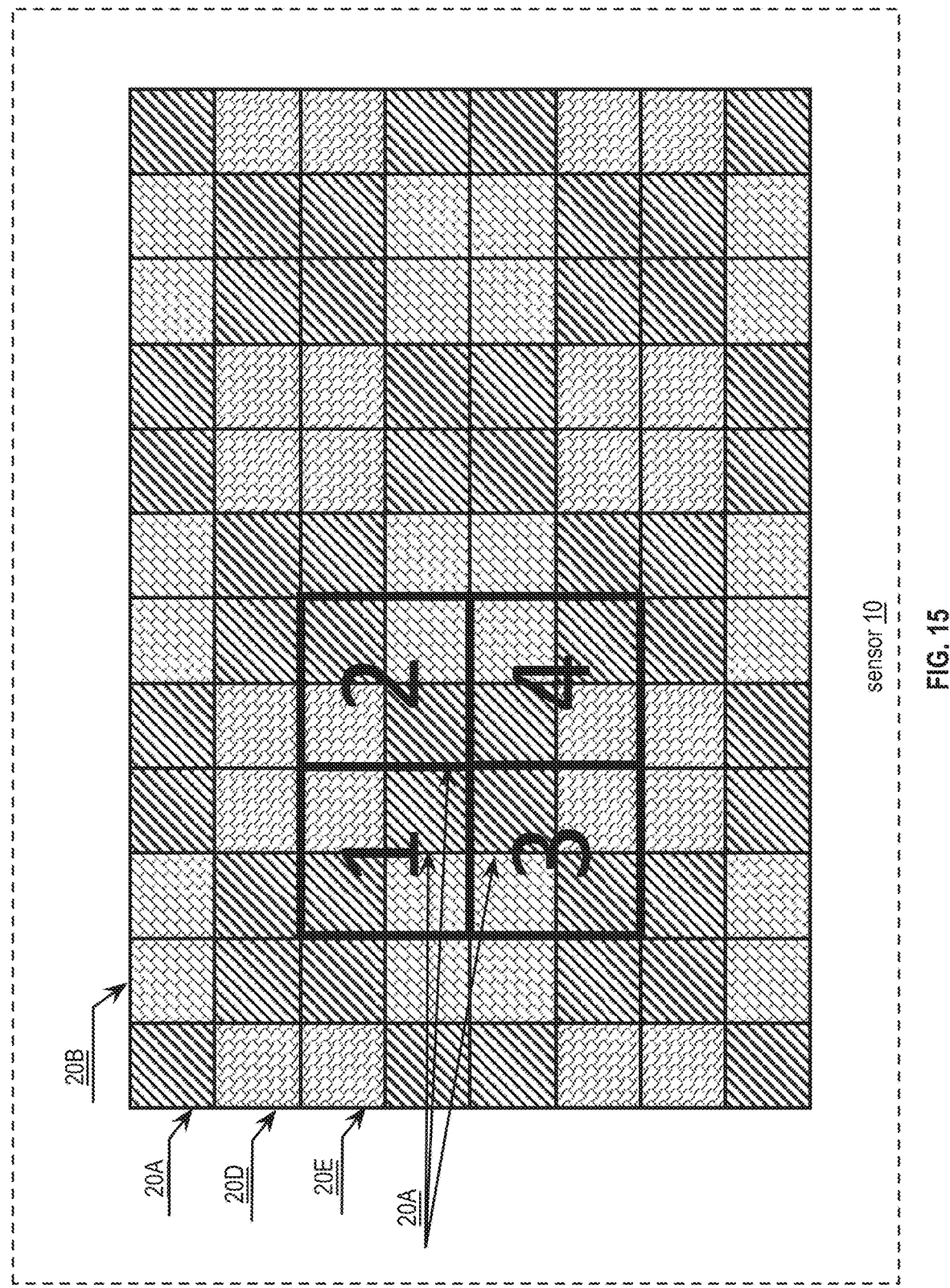

Referring to FIG. 1, a repeating mosaic pattern can necessarily maximize the number of transitions between filter bands (where filters configured to pass light in the same wavelength range are the same filter band). FIG. 15 provides an illustration of a filter structure that mirrors like filter bands in adjacent filter mosaics in order to reduce the number of transitions from one filter band to another. In the example, the patterns for 4 three filter mosaics 1-4 are modified so that filters 20A are adjacent to each other. In an example, crosstalk is reduced from a typical repeating pattern, because the number of transitions it reduced.

In a specific example of implementation, an example sensor system with 4 sets of interference filters includes a plurality of sets of interference filters that include a plurality of interference filters that are arranged in a pattern, where the pattern for each of the 4 sets of interference filters is modified so that 4 interference filters configured to pass light in the same wavelength range adjoin each other at a quadripoint. In another specific example of implementation, 2 sets of interference filters of a plurality of sets of interference filters include a plurality of interference filters that are arranged in a pattern, where the pattern for each of the 2 sets of interference filters is modified so that 2 interference filters configured to pass light in the same wavelength range are adjacent to each other about a centerline between the 2 sets of interference filters.

In an embodiment, a sensor system includes a plurality of optical sensors, one or more which are used for autofocusing. In a specific example of implementation, a set of interference filters of a plurality of sets of interference is adapted to locate a particular one interference filter of the plurality of interference filters atop the one or more optical sensors used for autofocusing.

In another embodiment, a sensor system includes a plurality of optical sensors and a plurality of sets of interference filters that are provisioned on the reverse side of the integrated circuit. In the example, the reverse side of the integrated circuit is opposite a side of the integrated circuit with wiring. In an example, the sensor system comprises a backside illumination image sensor. A back-illuminated sensor, also known as backside illumination (BSI or BI) sensor uses the novel arrangement of the imaging elements on the reverse side of the integrated circuit comprising an image sensor in order to increase the amount of light captured and thereby improve low-light performance. The increased light capture is at least partially due to the fact that the matrix of individual picture elements and its wiring reflect some of the light, and thus the sensor 10 can only receive the remainder of the incoming light, because the reflection reduces the signal that is available to be captured.

Figure 16:
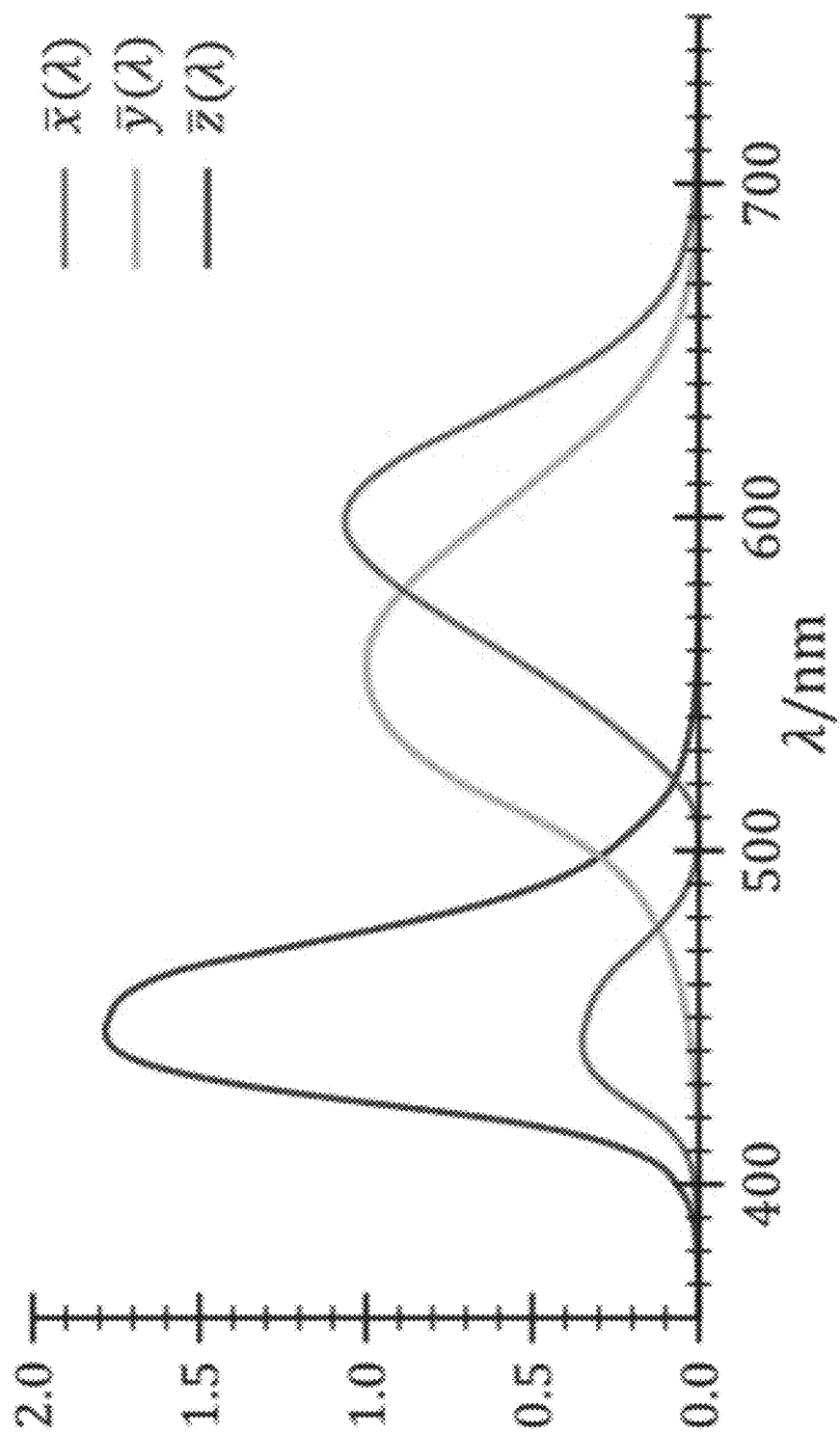

FIG. 16 provides an illustration of color matching functions for the CIE XYZ standard observer. (source: https://en.wikipedia.org/wiki/CIE_1931_color_space) The color matching functions can be thought of as the spectral sensitivity curves of three linear light detectors yielding the CIE tristimulus values X, Y and Z, where Y as luminance, Z is quasi-equal to blue, or the S cone response, and X is a mix of response curves chosen to be nonnegative. In an embodiment, the sensor system of FIGS. 1-16 include at least some of the plurality of interference filters of a set of interference filters are adapted to provide absolute-value color measurements (such as CIE tristimulus values X, Y and Z) when paired with an image sensor that includes plurality of optical sensors. In an example, absolute-value color measurements are measurements include both a brightness and a chromaticity.

Figure 17:
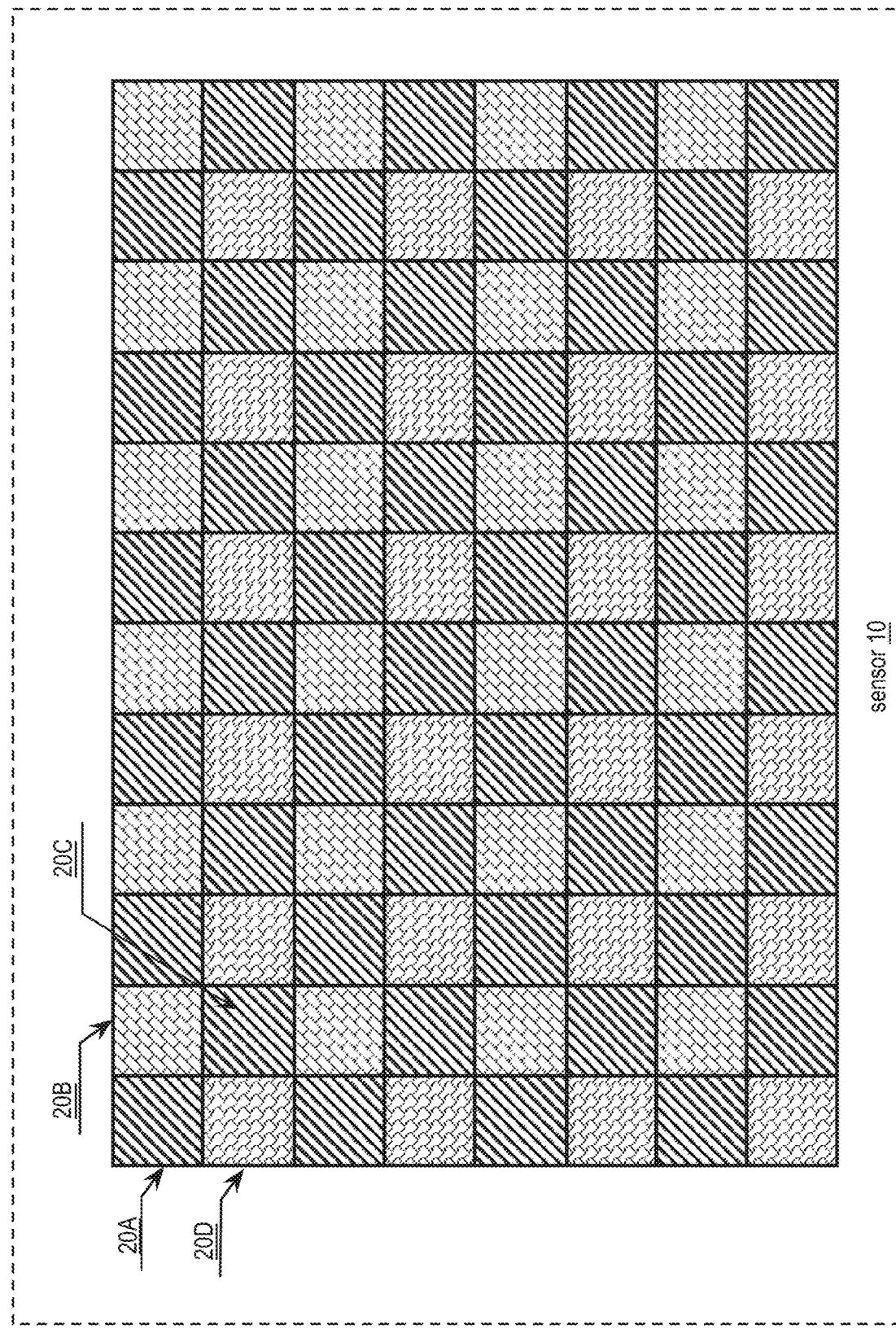

FIG. 17 provides a top-down illustration of a CIE/XYZ mosaic structure in a Bayer pattern. In the example, interference filters 20A-20D are patterned to form a true color sensor. The Bayer pattern (sometimes referred to as a Bayer mosaic or Bayer filter mosaic) is an array for arranging color filters on a square grid of optical sensors.

FIG. 18A provides a cross-section of adjacent Fabry-Perot filters 20A-20F overlaid by an optical element 80. In an example, an optical element is associated with one or more arrays of filters 20A-20F. FIGS. 18B and 18C illustrate the incorporation of optics over sub arrays (bands) of a multi-spectral array. In FIG. 18B, a single optic 130 is positioned over a sub-array or band of (filters 1-16) of a filter array 120, while in FIG. 18C each of 3 optics 140, 142 and 144 is positioned over a different repeating sub-array. For example filter sub-array 124 includes filters 1-9 (band 1), while filter sub-array 122 includes filters 10-13 (band 3) and filter sub-array 126 includes filters 14-16 (band 2) of a larger array. In a specific example of implementation, a sensor system includes a plurality of optics over a plurality of optical sensors, where each lens of the plurality of optics is associated with one or more sets of interference filters that are themselves associated with an optic of the plurality of optics. In an example, an optic comprises a lens and a low-pass optical element. In an example, the low-pass optical element of an optic is a diffuser and, in another example, a low-pass optical element is located a predetermined distance from a plurality of sets of interference filters so that a blurred image of predetermined blur dimensions is produced on the plurality of optical sensors. In a different example, 2 or more of a plurality of optics, such as the 3 optics illustrated in FIG. 18C overlap a portion of a larger array, such that each of the 2 or more optics cover a portion of the larger array. In another specific example, the optical element 80 can comprise an angular element, where the angular element is configured to select an input angle for light propagating to one or more sensors. In yet another specific example, optical element 80 can comprise an optical lens configured to rotate or tilt. Examples include optical image stabilization, lens rotation to change polarity of propagating light and/or another mechanical lens movement.

FIG. 18D is a cross-section of interference filter sub-arrays with associated optics. In an example of implementation and operation, a system includes a plurality of optical sensors on an integrated circuit, with a plurality of sets of interference filters, such as filters sets 184A and 184B. In the example, a set of interference filters, such as filters sets 184A and 184B are configured to pass light in a predefined spectral range, with each interference filter of the plurality of interference filters configured to pass light in a different wavelength range. In an example, the system includes a one or more optical elements, such as lenses 176A-176D where each optical element is associated with at least one set of interference filters, such as filters sets 184A and 184B to provide optics and interference filter set pairs. In another example of implementation, some of the interference filters of one or more sets of interference filters are Fabry-Perot filters.

In an example of implementation, one or more optical elements includes a filter, such as filter 178 from FIG. 18D and a lens, such as lenses 176C and 176D, to focus an image onto a group of pixels under filter set 184B. In an example, filters 178A and 178B are rejection filters adapted to reject unwanted out of band light. In another example, one or more optical elements includes more than one lens element, such as lenses 176C and/or 176D. In an example, baffles 174 are configured to support lenses 176A-176D, while isolating light incident on the pixels under a given set of filters. In the example, each optical element and interference filter pair comprises a sub-imager with pixels underlying the filter set, where multiple sub-imagers are likewise configured to provide spectral information for a given scene in a different spectral range. In yet another example, the optics is a plenoptic system.

In an example of implementation and operation, a first optical element and interference filter pair is configured to pass light in the ultraviolet (UV) spectrum, a second optical element and interference filter pair is configured to pass light in the infrared (IR) spectrum, and a third optical element and interference filter pair is configured to pass light in the visible spectrum. In another example of implementation some of the optical sensors of a plurality of optical sensors are not associated to any type of filter, allowing a panchromatic response.

In another example of implementation, rejection filters associated with optical elements are integrated on the integrated circuit using semiconductor processing techniques. In another example, some or all of the elements of a plurality of optical elements are manufactured using wafer-level optics, such as micro lenses.

In a specific example of implementation, a lens can be configured to defocus to produce a blurred image with predetermined blur dimensions and then focus to produce a focused image at the plurality of optical sensors. In a related example, the focused image is a high-resolution color image, while the blurred image is a low-resolution color balanced image. In another related example, a blurred image is used to provide a representative spectral response for the scene, where the representative spectral response includes a spectral response for a plurality of spatial areas of the scene. In yet another example of implementation, an optical lens is focused to form a high-resolution color image with the color sensors of an imager and defocused to form a low-resolution white balance image with the spectral sensors. Example optical lenses include compound lenses, Fresnel lenses, multi-focal Fresnel lenses, molded lens arrays, etc., and can be mechanically and/or electronically focused. The lenses can be integrated on silicon wafer during manufacture or they can be coated and/or assembled on a finished image sensor. In an example, defocusing the optical lens can be done automatically when capturing an image, or manually with a user selecting a white-balance capture mode as needed or desired.

FIG. 19A illustrates an imaging system incorporating a high-resolution and a low-resolution imager, whereas FIG. 19B illustrates an imaging system incorporating a high resolution with two low-resolution imagers. In the example, spectral sensor(s) 170 is configured to provide a lower resolution spectral image of a scene, while image sensor 172 is configured to provide a high-resolution image of the same scene. In an example, the response from spectral sensor(s) 170 can be used to provide color balancing of the spatial areas of a scene imaged with image sensor 172. The imaging system can include one or more processors for processing the color balancing of the scene imaged with image sensor 172 using the spectral responses from different spatial areas of the same scene.

In an example of implementation, a sensor system comprises a first group of optical sensors associated with sets of interference filters, where a set of interference filters includes a plurality of interference filters that are arranged in a pattern. In an example, each interference filter of the plurality of filters is configured to pass light in a different wavelength range and each set of interference filters of the plurality of interference filters is associated with a spatial area of a scene. In the example, a second group of optical sensors is configured to output an image; and one or more processors produce a spectral response for the plurality of spatial areas of the scene from the first group optical sensors and an image is output by the second group of optical sensors.

In an example, a demosaicing process is used to extract the spectral bandpass response from a set of filters. The demosaicing process can be enabled using one or more processors, where the processors use an algorithm or digital image process to reconstruct a bandpass response from optical sensors associated with individual filters of a set of filters. In an example where two groups of optical sensors are interspersed a demosaicing process can be used to retrieve spectral information from a subset of filters in an interspersed group or array.

In an example of implementation, the second group of optical sensors is configured to produce a higher resolution image, while the first group of optical sensors provides a lower resolution spectral response. The one or more processors utilizes the lower resolution spectral response for at least some of the spatial areas of a scene to modify the higher resolution image of the scene based on the spectral response of the included spatial areas. In an example, the modification of the higher resolution image includes a color correction for the included spatial areas of the image of the scene.

In another example of implementation, one or more processors utilize the spectral response for the spatial areas of a scene to classify one or more materials in the scene. In an example application, a low-spatial-resolution but high-spectral-resolution sensor image is combined with a high-spatial-resolution but low-spectral-resolution sensor image. In another embodiment, a first group of optical sensors that comprise the low-resolution spectral sensor provide spectral information of objects in a second group of optical sensors that comprise the high-resolution sensor. The spectral information can include information sufficient to determine properties of the object, such as material composition. The spectral information can further assist in identifying object types. Example applications can include, for example, skin sensing, water or oxygen detection, food detection, food analysis, quality inspection, plant analysis and drone surveillance.

In an example of implementation, a first group of optical sensors and a second group of optical sensors are adjacent to each other and in another example, the first group of optical sensors being adapted for use while in contact with one or more objects of a scene, while the second group of optical sensors is configured to not be in contact with the one or more objects. In another example, the first group of optical sensors and the second group of optical sensors are located on different image sensors. In yet another example, a first group of optical sensors and a second group of optical sensors are on a common image sensor, where individual sensors of the first group of optical sensors are distributed among optical sensors of the second group of optical sensors. In a related example, a sensor system includes one or more individual optical sensors of a first group of optical sensors and a plurality of optical sensors of a second group of optical sensors, where each of the first group of optical sensors is associated with a plurality of optical sensors of the second group of optical sensors.

In a specific example of implementation, one or more processors are used to approximate an output for one or more optical sensors of the second group of optical sensors from an output of the first group of optical sensors to produce an approximated output. And, in a further example, the approximated output is one of a red, green or blue sensor output. In yet another example, an approximated output from an optical sensor of the first group of sensors is used to replace an output for an optical sensor of the second group of optical sensors missing from a mosaic pattern of a subset of the second group of optical sensors. In an example, the optical sensor may be missing due to, for example, an optical sensor being replaced in the mosaic pattern with an optical sensor used for spectral sensing.

In other examples, additional functionality is combined with the imaging system of FIGS. 19A and 19B. For example, the imaging system can be adapted to collect information produce a three-dimensional map of at least a portion of the image, where, for example, the three-dimensional map can be used to determine approximate positions and interaction of objects in the scene. Further examples include adapting the imaging system to classify a material associated with one or more objects in the scene. The material can be classified based on illuminates, chromaticity or other phenomena.

In a related example, one or more 3D sensors adapted to output data associated with the scene can be included in an imaging system, where the imaging system is further adapted to produce a three-dimensional map based on the output data. In and additional example, the one or more 3D sensors comprise a 3D point sensor and/or a 3D image sensor.

In other examples, of additional functionality combined with the imaging system of FIGS. 19A and 19B. the imaging system is adapted to collect time-of-flight information for one or more objects in a scene where the time-of-flight information is used to determine an approximate position of one of more objects in the scene. In an example of implementation, the time-of-flight information is determined by modulating a signal and detection for of one or more objects in the scene. In another example, time-of-flight information is used to further modify the image output by a high-resolution sensor, where the image output is further modified to, for example, correct for light distortion based on a distance from the sensor system. In the example, the imaging system may include various lenses that can benefit from specific light distortion correction. Examples include, but are not limited to wide area lenses, ultrawide lenses, fish-eye lenses, telephoto lenses and others.

FIG. 20 provides a top-down illustration of a pixel array 172 with adjacent filter mosaics 182 on a sensor 10. In the pixel array 172 can be a standard pixel array, with the filter mosaics 182 comprising spectral sensors. In an example, N filter mosaics 182 can surround a pixel array 172, where N is any of 2 to 4.

FIG. 21 provides a block diagram of an imaging system incorporating a high-resolution image 200, a low-resolution imager 210 and a 3-image processor 220 adapted to produce a 4-image output 230. In an example embodiment, a camera system includes an image sensor, such as high-resolution image 200 that itself includes a number of sets of optical sensors, where each set of optical sensors includes a plurality of optical sensors arranged in a pattern. The camera further includes a spectral image sensor, that itself comprises a plurality of optical sensors, and a plurality of sets of interference filters, each of which sets are arranged in a pattern. Each interference filter of the plurality of filters is configured to pass light in a different wavelength range, and each set of interference filters of the plurality of interference filters is associated with an area of a scene being captured by the camera system. The camera system also includes one or more processors that are adapted to produce a spectral response for a plurality of areas of the scene from the spectral image sensor and combine the spectral response with an image output by the image sensor to produce a modified image.

In an embodiment of the camera system of FIG. 21, the modified image can be an image that is at least partially corrected for light distortion in at least some of the plurality of areas of the image output. In another example, the camera system is adapted to determine a light distortion type for at least some of the plurality of areas of the image output. Examples of light distortion types include, but are not limited to natural light, and various artificial light sources. The camera system can be further adapted to determine the frequency or duty cycle of a light source, such as whether a fluorescent light source is 50 Hz or 60 Hz.

In another embodiment, the camera system of FIG. 21 can be adapted to modify an image output, based on the spectral response, for display on one or more of a liquid crystal display, an organic light-emitting diode display, a quantum dot display (QD-OLED) or a plasma display. In yet another embodiment, the camera system can be adapted to modify the image output, based on the spectral response, for use on a display lacking an internal light source or on a display with a weak or selectable internal light source. Examples include displays that are used in high light environments, such as outside or in locations with enough light (such as an event location or in office environments with sufficient artificial light). In an example, a display that does not have a light source, but rather reflects light from outside the screen could be provided a modified image to optimize the display quality. Spectral response can, for example, be used to adjust a liquid crystal display to reflect a corrected color image.

In various embodiments, the camera system of FIG. 21, can be adapted to determine a direction of illumination for one or more objects in a scene and based on the direction of illumination, correct or otherwise enhance an image. Embodiments include, determining a light distortion type for at least some of the spatial areas of the image output and collecting information to produce a three-dimensional map of at least a portion of the image. In the example, any of direction of illumination, light distortion type(s) and the three-dimensional map can be used in combination to produce a further corrected and/or enhanced image. Yet other embodiments include determining a type of illumination for one or more objects in a scene and based on the type of illumination, correcting an image for light distortion, where the type of illumination can include one or more of white LED illumination, color LED illumination, phosphorus light source illumination, halogen light source illumination and various types of natural (sunlight) illumination.

In other embodiments, the camera system of FIG. 21, can include one or more intelligent agents that are capable of cognitive functions, such that the intelligent agents are at least partially used to produce a modified/corrected image. In another example, where the camera system of FIG. 21 includes one or more intelligent agents, wherein an intelligent agent is capable of cognitive functions, the intelligent agents can be used, for example, to determine a direction of illumination, produce a three-dimensional map and/or determine a light distortion type.

FIG. 22 is a flowchart illustrating an example method for correcting light distortion in a scene by an imaging system. The method includes a step 300, where a sample light spectrum is received from local sets of spectral sensors for the scene and continues at step 310, where an average spectral response is determined for each of the sample light spectra. The method continues with the imaging system collecting image data from an image sensor for the scene at step 320 and at step 330 the imaging system corrects the image data for each respective local areas of the scene using the averaged spectral response for the local area.

FIG. 23 is a flowchart illustrating an example method for modifying and/or correcting an image of a scene by an imaging system. The method includes a step 400, where a sample light spectrum is received from local sets of spectral sensors for the scene and continues at step 410, where an illumination type is determined for each local area of the scene. The method continues at step 420, where the imaging system produces a 3D map of the scene and continues at step 430 where a direction of illumination is determined for one or more objects in the scene. The method continues with the imaging system collecting image data from an image sensor for the scene at step 440 and at step 450 the imaging system corrects the image data for each respective local areas of the scene based on the illumination type, direction of illumination and 3D map to produce a corrected image.

FIG. 24 provides a top-down view of an optical sensor system using optical sensors/detectors comprising nanoscale semiconductor materials. Nanoscale semiconductor material based detectors, such as thin-film quantum dot photodiodes can be manufactured using narrow bandgap thin-films compatible with conventional semiconductor processing. In an example of implementation, the optical sensor system 10 incorporates thin-film quantum dots 120 of varying size in order to provide spectral responses across a predetermined spectrum, where the granularity and spectrum bandwidth of the thin-film is determined by the number and size of the quantum dots. The quantum dots can be, but are not limited to either epitaxial quantum dots and/or colloidal quantum dots.

In a specific example of implementation and operation, a sensor system comprises a plurality of nanoscale semiconductor sensors configured to sense light in different wavelength bands on an integrated circuit. In an example, the sensor system can be limited to optical sensors comprising nanoscale semiconductors. In another example, the sensor system can include Fabry-Perot filters associated with CMOS optical sensors. Nanoscale semiconductor elements can include one or more of quantum dots, colloidal nanoparticles, CdSe nanocrystals and ZnS nanocrystals, etc. In a specific example of implementation, the nanoscale semiconductor elements can be implemented in different "dot" sizes, where the dot size dictates the wavelength of the spectral response for a given nanoscale element. In the example, various dot sizes are distributed on the sensor system in order to provide a spectrum of a given bandwidth and granularity.

FIG. 25 provides a cross-section of adjacent Fabry-Perot filters overlaid by an optical angular element in accordance with the present invention. In an example, an optical element 130 is associated with one or more arrays of filters 20A-20F. In a specific example of implementation, optical element 130 can comprise an optical lens configured to rotate or tilt. Examples include optical image stabilization, optical element rotation to change polarity of propagating light and/or another mechanical lens movement.

In another example of implementation and operation, the optical element 80 of FIG. 2 comprises a plurality of integrated polarization elements (filters). In an example, the combination of polarization filters enable the sensor system 10 to distinguish between or separate polarized light and unpolarized light. In another example, the combination of polarization elements can enable the sensor system to separate light into different polarizations. In an example this polarization information can be used to detect the illuminant spatial/directional information and/or information about reflectance from objects in a scene or image. In another example, the polarization information can be used to detect glare and/or reflections in an image being imaged.

In a specific example of implementation and operation, a sensor system 10 comprises a plurality of optical sensors on an integrated circuit, with a plurality of polarization filters disposed on top of the sensor system 10. In an example, the optical sensors can constitute an optical sensor and polarization filter pair, and, in another example, multiple polarization filters can be associated with a single optical sensor and in yet another example, a single polarization filter can be associated with multiple optical sensors. The sensor system 10 can include one or more processors with one or more modules for determining polarization information based on the output of the optical sensor with its paired polarization filter(s). In an example, the polarization information can include one or more of 1) illumination type for light detected by the optical sensor of an optical sensor and polarization pair; 2) the distribution of spatial information for light detected by the optical sensor of an optical sensor and polarization pair; 3) directional information for light detected by the optical sensor of an optical sensor and polarization pair; and 4) reflection information for light reflected by an object imaged by the sensor system.

In another specific example of implementation and operation, a sensor system 10 comprises a plurality of optical sensors on an integrated circuit, with an optical system 80 disposed on top of the sensor system 10. In the example the optical system can be used to select specific input angles for light incident to the sensor system 10 and in another example the input angles can be used to determine a location for light sources in a scene being imaged. In an example, the optical system 80 comprises a single optical element and in another example, it comprises a plurality of optical elements.

In a specific example of implementation and operation, a sensor system 10 comprises a plurality of optical sensors on an integrated circuit, with one or more optical elements 80 are located atop at least some of the plurality of optical sensors, where the one or more optical elements 80 are configured to select input angles for light incident to the sensor system. In another example a processor can be used to determine a direction for light collected by one or more optical sensors of the plurality of optical sensors based on the selected input angles. In an example, the determined light direction can be used to inform white balance modification or correction for a scene or object being imaged, where the white balance modification or correction is executed by a processor associated with the sensor system 10, or in an alternative, where the determined light direction is provided to an external processing system for white balance modification or correction.

In another specific example of implementation and operation, optical element(s) 80 are common to all of the optical sensors in the sensor system 10 and in another example, the optical element(s) are common to only a portion of the optical sensors in sensor system 10.

Several options are available for optical element(s) 130. In an example, optical element(s) 130 comprise optical lenses and in another example the optical element(s) 130 comprise one or more masks located proximate to the optical sensors, wherein a mask comprises a light shield with a different lateral offset for at least some of the optical sensors of sensor system 10. In the example, each mask is configured to allow some incident angles of light while shielding other incident angles of light. The mask can be a single line of various materials, such as metal or another opaque material or it can comprise a grid that is configured to provide shielding for an array of optical sensors.

In another specific example of implementation and operation, optical element(s) 130 are optical micro-lenses; examples include, but are not limited to, Fresnel lenses and/or molded lens arrays. In another specific example, the optical element(s) 130 include mechanical elements so that they can be rotated and/or tilted. In the example the optical element(s) 130 can be part of the optical image stabilization system for a camera incorporating the sensor system. In another specific example of implementation and operation, optical element(s) 130 are micro-lenses, where each micro-lens is adapted to select input angle(s) for one or some portion of the optical sensors in the sensor system 10. In yet another specific example of implementation and operation, optical element(s) 130 are polarization filters.

FIG. 26 illustrates a scene with one or more light sources. In the scene, light sources can illuminate a scene from behind, such as light source 140, and from the front and/or below, such as light source 142. In an example, white balance information can be included with digital imaging data, allowing for the use of the white balance information in post-processing of an image or video. In a specific example, in order to provide for realistic lighting of an object added to the image, such as in an augmented reality system, illumination of the object can be adjusted to match the illumination of the scene. In the example similar to FIG. 25, an object (in this example a plastic shark) is added to a pre-existing image and localized white balance information from the pre-existing image can be used to provide realistic lighting by illuminating the shark consistent with the pre-existing image. In an augmented reality application, the illumination and/or shading of one or more objects can be adjusted so as to make the objects more realistically represented in the scene. Additionally, light direction information, such as that referred to in FIG. 25 can be used to inform illumination of an object added to the pre-existing scene.

In a specific example of implementation and operation, a sensor system is used to collect spectral information, such as white balance information, from a scene. The sensor system can comprise a plurality of optical sensors with a plurality of sets of interference filters. In an example, a set of interference filters of the plurality of sets of interference filters can be arranged in a pattern, wherein each interference filter of the plurality of filters is configured to pass light in a different wavelength range, with each set of interference filters associated with a spatial area of the scene. In example of implementation, the sensor system can include one or more processors adapted to provide a spectral response based on an output from the plurality of optical sensors and determine spatial areas of the scene that potentially represent sources of light based on the spectral response from each of the plurality of spatial areas of the scene.

In an example, the one or more processors can be adapted to identify the spatial areas of the scene that represent sources (and intensity) of light for use to light one or more objects added after the digital image of the scene is collected. In a related example, information associated with the spatial areas of the scene that represent sources of light can be embedded in the digital image, provided as an addendum to the digital image and/or provided as a supplemental data file.

FIG. 27A is a flowchart illustrating an example method for collecting a digital image of a scene. The method starts at step 460, where received light spectra from a scene are received from sets of spectral sensors that are spatially separated from each other. In an example, each set of spectral sensors is associated with an image sensor. In an alternative example, each set of spectral sensors is associated with a spatial area of the scene that is associated with a complementary spatial area of an image sensor. The method continues at step 464 with the light characteristics of the light spectra are classified for each of the spatial areas of the image sensor. The method then continues at step 462, with the received light spectra being used to determine whether one or more sets of spectral sensors indicate a light source in the scene. When no light sources are detected, average white balance (AWB) for the scene is adjusted normally at step 468. In an example, the relative intensity of the light source(s) can be determined and in another example, when a light source is not located within the scene, the location and/or intensity of a light source outside of the scene can be determined based on reflections from objects within the scene. In another example, the light source location can be used to determine areas of the scene being imaged and/or objects in the scene that are in a shade. At an optional step 466, the spatial areas associated with the light sources are identified. The method then continues at step 470 the light source information, including the spatial area of the light source and a classification type are provided for the digital image. In an example, the light source information can be used to adjust the white balance and or color homography for spatial areas of the scene.

FIG. 27B is another flowchart illustrating an example method for collecting a digital image of a scene. The method starts at step 480, where received light spectra from a scene are received from sets of spectral sensors that are spatially separated from each other. In an example, each set of spectral sensors is associated with an image sensor. In an alternative example, each set of spectral sensors is associated with a spatial area of the scene that is associated with a complementary spatial area of an image sensor. The method then continues at step 482, with the received light spectra being used to determine whether one or more sets of spectral sensors indicate a light source in the scene. When no light sources are detected, average white balance (AWB) for the scene is adjusted normally at step 488. The method continues at step 484 with the light characteristics of the light spectra being classified for each of the spatial areas of the image sensor. In an example, the relative intensity of the light source(s) can be determined and in another example, when a light source is not located within the scene, the location and/or intensity of a light source outside of the scene can be determined based on reflections from objects within the scene. In another example, the light source location can be used to determine areas of the scene being imaged and/or objects in the scene that are in a shade. At an optional step 486, the spatial areas associated with the light sources are identified. The method then continues at step 490 the light source information, including the spatial area of the light source and a classification type are provided for the digital image.

In a specific example of implementation and operation, the light information provided in step 470 and step 490 of FIGS. 27A and 27B, respectively, can be used to aid in post processing of the digital image. In another example, the light information can be used to adjust the illumination of objects added to the digital image in post processing. For example, once the spatial areas and associated light sources are classified, that information can be provided in addition to the captured image, so that it is available to be used in post processing when an object is subsequently added to the captured image. Referencing the example illustrated in FIG. 26, the plastic shark can be added to the captured image of the room, with the light information being used in post processing to properly place the light intensity and coloration on the plastic shark. In yet another example, the light information can be used to adjust the illumination of the scene captured in the digital image to provide desired effects on the scene, such as improving aesthetics of the scene or to artificially change the aesthetics of the scene. In an example of implementation, the illumination of a scene can be adjusted to provide a more natural effect using the light information provided in step 470 and step 490 of FIGS. 27A and 27B, respectively. In an alternative implementation, the illumination of a scene can be adjusted to augment or refine special effects using the light information provided in step 470 and step 490 of FIGS. 27A and 27B, respectively In a specific example of implementation and operation, light information can be provided while video imaging of a scene or object, so that the captured video can be substantially corrected in post processing. In an example, each frame of the captured video can include at least some light information. In another example, the light information can be provided with the video imaging data on an intermittent basis (as opposed to frame-by-frame) so that the captured video can be corrected on a frame by frame basis by interpolating the light information missing from the frames without light information data. In yet another example, light source information, such as classification and/or intensity can be linked to objects or scene portions during the video coding of the imaged scene, so that the light information can be ignored until a scene or object moves or changes, thereby enabling improved compression and/or reduced computation complexity of a captured video or image. In yet another specific example, a video capture system can be adapted to include light information only when toggled on by a user, so that light information, such light as classification and/or intensity would not be processed and/or captured when toggled off.

In an example, a camera system is adapted to determine a light distortion type for at least some of the plurality of areas of an image output. (examples of light distortion types include, but are not limited to natural light, and various artificial light sources.) The camera system can be further adapted to determine the frequency or duty cycle of a direct light source and/or ambient lights source, such as whether a fluorescent light source is 50 Hz or 60 Hz. In yet another example, the camera system can be further adapted to lock a negative feedback compensation loop to match the frequency or duty cycle and/or phase of the light source and then attenuate and/or cancel the resultant flicker of the light source. In an example, an optical amplifier can be used to compensate for frequency effects by modifying the gain and phase characteristics of the amplifier's open loop output or of its feedback network, or both, in order compensate for the conditions leading to oscillation. In an example, the locked negative feedback compensation loop for a flicker disturbance can be provided to a plurality of (or all) affected pixels of a camera system, avoiding the saturation of those pixels by the flicker disturbance.

FIG. 28 is a flowchart illustrating an example method for compensating for ambient light flicker in a scene being captured by a digital imaging system. The method starts at step 500, where received light spectra from a scene are received from sets of localized spectral sensors. In step 510 an illumination type is determined for the scene and at step 520 the digital imaging system determines whether ambient light flicker is detected in the scene. If there is no light flicker detected the digital imaging system can adjust white balance for the scene at step 550 and when light flicker is detected the digital imaging system can use a negative feedback loop at step 530 to lock to the frequency and phase of the flicker source in order to compensate for the light flicker at step 540.

FIG. 29A illustrates the separate spectral responses for two spectral sensors (pixels) having adjacent central wavelengths, such as spectral sensors based on Fabry-Perot filters, typically provide spectral responses in narrow bands (such as 10 nm). Sometimes a spectral response in a wider band (such as 20 nm or 30 nm) is desired. FIG. 29B illustrates the combined spectral responses for the two spectral sensors of FIG. 29A, effectively doubling the spectral response bandwidth. In an example of implementation and operation, a sensor system includes an array of optical sensors and a plurality of spectral filters arranged in an array proximate to the array of optical sensors. In an example, the spectral filters are interference filters, such as Faby-Perot filters or plasmonic interference filters and organic filters. In an example, each optical sensor is associated with one or more spectral filters of the plurality of spectral filters, where each spectral filter of the plurality of spectral filters is configured to pass light of a selected wavelength range. In an example, electronic circuitry is coupled to the optical sensors, so that the output of two or more optical sensors can be combined.

FIG. 29C illustrates a pair of adjacent interference filters (1) each associated with an optical sensor. In an example, the interference filters (1) are configured to pass wavelengths in adjacent ranges of a light spectrum. In an example, the output of the adjacent sensors (2) is combined to produce a combined output with wider spectral response bandwidth, as illustrated in FIG. 29B. In an example, the output of the adjacent sensors (2) can be combined using dedicated electronic circuitry, or, in another example, it can be combined by one or more modules of a computing device.

FIG. 29D illustrates a pair of adjacent interference filters (1) associated with a single optical sensor (2). In an example, incident light passing through both of the adjacent filters (1) is detected by the single optical sensor (2). In an example of implementation and operation, a sensor system includes an array of optical sensors and a plurality of spectral filters arranged in an array proximate to the array of optical sensors. In an example, the spectral filters are interference filters, such as Faby-Perot filters or plasmonic interference filters and organic filters. In a specific example, an optical sensor is associated with two or more spectral filters of the plurality of spectral filters, where each spectral filter of the plurality of spectral filters is configured to pass light of a selected wavelength range. In the example, the two or more spectral filters of the plurality of spectral filters are configured to pass light in substantially adjacent wavelength ranges, so that sensor 2 receives effectively double the wavelength of either of the interference filters (1) alone.

FIG. 29E illustrates a pair of interference filters (1) placed one atop the other and associated with a single optical sensor (2). In an example of implementation and operation, a sensor system includes an array of optical sensors and a plurality of spectral filters arranged in an array proximate to the array of optical sensors. In an example, the spectral filters are interference filters, such as Fabry-Perot filters or plasmonic interference filters. In a specific example, a first array of spectral filters is arranged in an array over an array of optical sensors, where each optical sensor of array of optical sensors is associated with at least one spectral filter of the first array of spectral filters, and each spectral filter is configured to pass light of a selected wavelength range. In an example, a second array of spectral filters is arranged in an array atop the first array of spectral filters to produce spectral filter pairs, where each spectral filter of the second array of spectral filters is configured to pass light of a selected wavelength range, where each spectral filter pair of the plurality of spectral filter pairs includes two or more spectral filters that together are configured to pass light in substantially adjacent wavelength ranges. In an example, each filter pair is configured to pass light to a single optical sensor.

As discussed above, compensating for light source distortion using automatic white balance (AWB) correction enables an image sensor for more accurately representing the expected colorimetry of a recorded scene or object. In an example of implementation and operation, uniform AWB correction can be enhanced by blurring and/or scrambling a scene spatially when an imager is receiving input for AWB correction. The blurred image can provide more uniform color detection for de-mosaicing a given set of spectral filter responses.

In an example of implementation and operation, a sensor system for imaging a scene, can include a plurality of optical sensors on an integrated circuit with a plurality of sets of interference filters, where each set of interference filters includes interference filters arranged in a pattern. Each interference filter of the plurality of filters is configured to pass light in a different wavelength range, and each set of interference filters of the plurality of interference filters is associated with a spatial area of the scene. In an example, a lens system is configured atop the plurality of optical sensors, where the lens system is adapted to produce a blurred image with substantially predetermined blur dimensions at the plurality of optical sensors. In an example, the lens system is configured to defocus to produce the blurred image with substantially predetermined blur dimensions and also focus to produce a substantially focused image at the plurality of optical sensors. In a specific example, the lens system is made of multiple elements, and the lens system is configured to defocus by adjusting one more element of the multiple elements while not adjusting other elements of the one or more elements.

In another specific example, the lens system can be adapted to introduce spherical aberrations and/or other coherency aberrations to increase the blurring of a scene for AWB correction purposes. In yet another specific example, the lens system can comprise a large field of view (FOV) and low chief ray angles. The large field of view enables a given imager to detect additional light and capture a broad scene, while the low chief ray angles reduce the incident angles for incident light reaching the spectral filters, such as interference-based filters. FIG. 7 illustrates a lens system with a reverse telecentric design. The reverse telecentric design provides a large field of view and a low chief ray angle, such that by adjusting the elements of the telecentric design an image can be blurred for AWB correction while being adjustable to focus the image for high-spatial resolution image capture. Telecentric lenses are known to provide an orthographic projection, providing the same magnification at all distances. An object that is too close may still be out of focus, but the resulting blurry image will have the same size as the correctly focused image would. In a reverse telecentric lens system one or more elements of a telecentric lens system are reversed, resulting in a more uniform color distribution to the spectral filters.

Electronics manufacturers increasingly utilize displays with underlying image sensors in smartphones, tablets, and other mobile devices utilizing cameras. When image sensors are under a display, spectral recoloring of an image can result, due at least in part to the active colors emitted by the display corrupting the image. Spectral sensors can be implemented under a display in order to mitigate the impact of the display on an imager located under the display while also providing input for automatic white balancing (AWB). In a specific example of implementation and operation, a sensor system for imaging a scene includes a first array of optical sensors and a plurality of sets of interference filters associated with the first array of optical sensors. Each set of interference filters of the plurality of sets of interference filters includes a plurality of interference filters that are arranged in a pattern, where each interference filter of the plurality of interference filters is configured to pass light in a different wavelength range. Each set of interference filters of the plurality of interference filters is associated with a spatial area of the scene. In an example, the sensor system includes a second array of optical sensors that are configured to output an image and a processor with one or more modules adapted to produce a spectral response for a plurality of spatial areas of the scene from the first array optical sensors and an image output by the second array of optical sensors. In the example, a display is located atop the first plurality of optical sensors and the second plurality of optical sensors.

Spectral sensors are presented in general as a means to improve the signals from image sensors located under displays. Although in the example given the spectral sensor and the image sensor are presented as separate entities, a hyperspectral camera can implement both functions (spectral measurements and imaging) with the same optical sensor(s).

In a specific example of operation, the first array of optical sensors and the second array of optical sensors are adjacent to each other under the display. In the example, spectral response provided by the first array of optical sensors can be used to correct for light distortion and other artifacts for a scene being imaged by the second array of optical sensors. In another example, the second array of optical sensors outputs a monochromatic image, while the output from the first array of optical sensors can be used to provide color information for the monochromatic image.

In another example, a portion of the optical sensors from the first array of optical sensors can be used to correct for the interference from the display on an image generated by the second array of optical sensors, with another portion of the optical sensors from the first array of optical sensors being available to provide color information for automatic white balancing (AWB). In a related example, optical sensors from the first array associated with interference filters configured to pass light in a certain wavelength ranges may be used to correct for display interference, while optical sensors from the first array associated with interference filters configured to pass light in a other wavelength ranges are used to correct for automatic white balancing (AWB). In an example, the processor can be further adapted to detect a change over time on the display colorimetry based on an output from the display and/or the spectral response for the plurality of spatial areas.

It is noted that terminologies as may be used herein such as bit stream, stream, signal sequence, etc. (or their equivalents) have been used interchangeably to describe digital information whose content corresponds to any of a number of desired types (e.g., data, video, speech, text, graphics, audio, etc. any of which may generally be referred to as 'data').

As may be used herein, the terms "substantially" and "approximately" provide industry-accepted tolerance for its corresponding term and/or relativity between items. For some industries, an industry-accepted tolerance is less than one percent and, for other industries, the industry-accepted tolerance is 10 percent or more. Other examples of industry-accepted tolerance range from less than one percent to fifty percent. Industry-accepted tolerances correspond to, but are not limited to, component values, integrated circuit process variations, temperature variations, rise and fall times, thermal noise, dimensions, signaling errors, dropped packets, temperatures, pressures, material compositions, and/or performance metrics. Within an industry, tolerance variances of accepted tolerances may be more or less than a percentage level (e.g., dimension tolerance of less than +/−1%). Some relativity between items may range from a difference of less than a percentage level to a few percent. Other relativity between items may range from a difference of a few percent to magnitude of differences.

As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to".

As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may be used herein, one or more claims may include, in a specific form of this generic form, the phrase "at least one of a, b, and c" or of this generic form "at least one of a, b, or c", with more or less elements than "a", "b", and "c". In either phrasing, the phrases are to be interpreted identically. In particular, "at least one of a, b, and c" is equivalent to "at least one of a, b, or c" and shall mean a, b, and/or c. As an example, it means: "a" only, "b" only, "c" only, "a" and "b", "a" and "c", "b" and "c", and/or "a", "b", and "c".

As may also be used herein, the terms "processing module", "processing circuit", "processor", "processing circuitry", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, processing circuitry, and/or processing unit may be, or further include, memory and/or an integrated memory element, which may be a single memory device, a plurality of memory devices, and/or embedded circuitry of another processing module, module, processing circuit, processing circuitry, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, processing circuitry, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, processing circuitry and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, processing circuitry and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with one or more other routines. In addition, a flow diagram may include an "end" and/or "continue" indication. The "end" and/or "continue" indications reflect that the steps presented can end as described and shown or optionally be incorporated in or otherwise used in conjunction with one or more other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid-state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A system for imaging a scene, comprising:
a plurality of optical sensors on an integrated circuit;
a plurality of sets of interference filters, wherein a set of interference filters of the plurality of sets of interference filters includes a plurality of interference filters arranged in a pattern, wherein each interference filter of the plurality of interference filters is configured to pass light in a different wavelength range, wherein each set of interference filters of the plurality of sets of interference filters is associated with a spatial area of the scene;
a first processor module adapted to provide a spectral response for a spatial area of the scene;
a second processor module adapted to determine, based on the spectral response, light distortion associated with the spatial area; and
a third processor module adapted to provide, based on the light distortion, a white balance correction for the spatial area.

2. The system of claim 1, further comprising:
a plurality of rejection filters arranged in a pattern, wherein the plurality of rejection filters is associated with one or more sets of interference filters, wherein each rejection filter of the plurality of rejection filters is configured to substantially reject light of one or more predetermined wavelengths.

3. The system of claim 2, wherein the plurality of optical sensors, the plurality of sets of interference filters and the plurality of rejection filters are formed on a backside of an integrated circuit.

4. The system of claim 2, wherein one or more rejection filters of the plurality of rejection filters is another interference filter, wherein the another interference filter is one of the plurality of interference filters and wherein the another interference filter is at the same time configured to pass light in a particular wavelength range for an first optical sensor and interference filter pair and reject light for a second optical sensor and interference filter pair.

5. The system of claim 2, wherein the plurality of rejection filters is located atop one or more sets of interference filters.

6. The system of claim 2, wherein the plurality of rejection filters has a respective top surface and a respective bottom surface and the plurality of sets of interference filters has a respective top surface and a respective bottom surface, wherein the bottom surface of the plurality of rejection filters is located proximal to the top surface of the plurality of sets of interference filters.

7. The system of claim 2, wherein the plurality of rejection filters has a respective top surface and a respective bottom surface and the plurality of sets of interference filters has a respective top surface and a respective bottom surface, wherein the top surface of the plurality of rejection filters is located proximal to the bottom surface of the plurality of sets of interference filters.

8. The system of claim 2, wherein a plurality of interference filters of the set of interference filters is associated with each rejection filter of the plurality of rejection filters.

9. The system of claim 1, wherein the plurality of sets of interference filters includes a number of sets of interference filters that is less than the plurality of optical sensors.

10. The system of claim 1, wherein each set of interference filters of the plurality of sets of interference filters is associated with a set of optical sensors of the plurality of optical sensors.

11. The system of claim 1, wherein the set of interference filters is arranged in a pattern that further includes a plurality of organic filters.

12. The system of claim 1, wherein the set of interference filters is arranged in a pattern that further includes a plurality of non-interference filters, wherein the non-interference filters are selected from a group that consists of at least one of organic filters and plasmonic filters.

13. The system of claim 12, wherein the at least one organic filter is adapted to pass infrared light wavelengths.

14. The system of claim 1, wherein at least one set of interference filters of the plurality of sets of interference filters is arranged in a pattern that further includes at least one interference filter that is respectively larger in size than at least one other interference filter in the set of interference filters.

15. The system of claim 14, wherein the at least one interference filter that is respectively larger in size than at least one other interference filter in the set of interference filters is in an elongated rectangle shape.

16. The system of claim 1, wherein the plurality of optical sensors includes a plurality of sets of optical sensors, wherein each set of optical sensors is arranged in a pattern that includes at least one optical sensor that is respectively larger in size than at least one other optical sensor of the set of optical sensors.

17. The system of claim 1, wherein the pattern for the plurality of interference filters is a mosaic and the system is adapted to generate spectral information that includes a bandpass response from one or more sets of interference filters of the plurality of interference filters.

18. The system of claim 17, wherein the bandpass response is determined based on a de-mosaicing of the mosaic.

19. A method for imaging a scene comprises:
sampling, by an imaging system, a received light spectrum from a set of spectral sensors of a plurality of sets of spectral sensors, wherein each set of spectral sensors includes a plurality of spectral sensors that are each spatially separate from every other spectral sensor of the set of spectral sensors, wherein each spectral sensor of the set of spectral sensors is associated with one or more optical sensors associated with the imaging system;
comparing the received light spectrum to a plurality of light spectrum types;
based on the comparing, determining whether the received light spectrum from the set of spectral sensors is representative of a light spectrum type of the plurality of light spectrum types; and
in response to a determination that a received light spectrum is representative of a light spectrum type, providing information for adjusting a color balance for at least a portion of the scene.

20. The method of claim 19, further comprising:
comparing the received light spectrum to a plurality of light source directionalities, wherein light source directionality is a location of the light source relative to a scene;
based on the comparing, determining a light source directionality for the light source; and
in response to a light source directionality determination, providing information for adjusting a color balance for the image sensor.

\* \* \* \* \*